US012805209B2

(12) United States Patent
Son et al.

(10) Patent No.: US 12,805,209 B2
(45) Date of Patent: Nov. 17, 2026

(54) STRETCHABLE SELF-HEALING RESISTIVE RANDOM ACCESS MEMORY AND MANUFACTURING METHOD THEREOF

(71) Applicant: Research & Business Foundation SUNGKYUNKWAN UNIVERSITY, Suwon-si (KR)

(72) Inventors: Donghee Son, Suwon-si (KR); Minbaek Lee, Incheon (KR); Duhwan Seong, Incheon (KR); Jinhong Park, Incheon (KR); Yong Jun Park, Incheon (KR)

(73) Assignee: RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 441 days.

(21) Appl. No.: 18/390,629

(22) Filed: Dec. 20, 2023

(65) Prior Publication Data

US 2024/0215465 A1 Jun. 27, 2024

(30) Foreign Application Priority Data

Dec. 22, 2022 (KR) ........................ 10-2022-0182267

(51) Int. Cl.
*H10N 70/00* (2023.01)
*B22F 1/05* (2022.01)
(Continued)

(52) U.S. Cl.
CPC ............. *H10N 70/881* (2023.02); *B22F 1/05* (2022.01); *B22F 1/10* (2022.01); *B32B 27/08* (2013.01);
(Continued)

(58) Field of Classification Search
CPC ........ B22F 1/10; B22F 1/05; B22F 2301/255; B22F 7/08; B32B 27/08; B32B 27/20;
(Continued)

(56) References Cited

U.S. PATENT DOCUMENTS

2006/0049390 A1 3/2006 Ufert et al.
2021/0111343 A1* 4/2021 Jiang .................... H10N 70/041

FOREIGN PATENT DOCUMENTS

KR 10-2102186 B1 4/2020
WO WO 2017/029660 A1 2/2017

OTHER PUBLICATIONS

Korean Office Action issued on Mar. 7, 2024, in counterpart Korean Patent Application No. 10-2022-0182267 (8 pages in English, 8 pages in Korean).

* cited by examiner

*Primary Examiner* — Wasiul Haider
(74) *Attorney, Agent, or Firm* — LEX IP MEISTER, PLLC

(57) ABSTRACT

An embodiment of the present invention provides a stretchable self-healing resistive random-access memory and a manufacturing method thereof, which implements the characteristics of a non-volatile resistive random-access memory by fabricating a composite film having a concentration gradient of a conductive metal formed therein in a way of mixing self-healing stretchable polymer and conductive metal powder, adjusting the concentration, and drying the mixture, so that one side has conductive properties and the other side has insulating properties, and then laminating the fabricated composite film.

22 Claims, 23 Drawing Sheets

(51) Int. Cl.

| | |
|---|---|
| ***B22F 1/10*** | (2022.01) |
| ***B32B 27/08*** | (2006.01) |
| ***B32B 27/20*** | (2006.01) |
| ***H10N 70/20*** | (2023.01) |

(52) U.S. Cl.
CPC ........... *B32B 27/20* (2013.01); *H10N 70/021* (2023.02); *H10N 70/20* (2023.02); *B22F 2301/255* (2013.01); *B32B 2307/202* (2013.01); *B32B 2307/206* (2013.01); *B32B 2457/00* (2013.01)

(58) Field of Classification Search
CPC .......... B32B 2307/202; B32B 2457/00; H10N 70/881; H10N 70/021; H10N 70/20; H10B 63/00
See application file for complete search history.

STRETCHABLE SELF-HEALING RESISTIVE RANDOM ACCESS MEMORY AND MANUFACTURING METHOD THEREOF

CROSS REFERENCE TO RELATED APPLICATION

The present application claims priority to Korean Patent Application No. 10-2022-0182267, filed Dec. 22, 2022, the entire contents of which is incorporated herein for all purposes by this reference.

BACKGROUND OF THE INVENTION

Field of the Invention

The present invention relates to a resistive random-access memory (RRAM), and more specifically, to a stretchable self-healing resistive random-access memory and a manufacturing method thereof, which implements the characteristics of a non-volatile resistive random-access memory by fabricating a self-healing stretchable composite film having a concentration gradient of a conductive metal fillers formed therein in a way of mixing self-healing stretchable polymer and conductive metal powder, adjusting the concentration, and drying the mixture, so that one side has conductive properties and the other side has insulating properties, and then laminating the fabricated self-healing composite films.

Description of the Related Art

Generally, a resistive random-access memory is a device showing the characteristics of a memory that change from a non-conductive state (OFF state), in which resistance of an oxide film is high due to the voltage applied to electrodes, to a conductive state of low resistance (ON state). Since the structure of the resistive random-access memory device operates at a high speed at a low voltage of 5V or less, the memory device is not degraded from the aspect of writing and erasing time and shows excellent characteristics in terms of stability.

In addition, closed-loop electronic medical systems having interactive functions for recording physiological signals of a human body, analyzing these signals using big data processing, and delivering feedback therapy to abnormal tissues are spotlighted recently. More recently, in relation to a method capable of stably storing or accurately processing personal data, neuromorphic engineering, which uses very high-density integrated circuit systems including electronic analog circuits to mimic neurobiological structures existing in nervous systems, has been suggested as it is regarded as extremely important in implementing these smart bioelectronic systems.

In relation thereto, resistive random-access memory devices as a soft resistive switching random-access memory with low power consumption, high switching speed, and long retention time are promising candidates that can store massive amounts of information or act as a neuromorphic module embedded with artificial intelligence. In addition, a two-terminal structure is more efficient for implementing high-density storage cells than floating gate/charge-trap memory devices. However, development of soft and biocompatible high-performance resistive random-access memory with a mechanical modulus comparable to those of various living tissues is an essential prerequisite condition for realizing tissue-like bioelectronic systems.

To meet this requirement, many research groups have adopted strain-dissipative structural designs or intrinsically stretchable materials. Although these efforts have shown feasibility of strain-insensitive stable electrical operation of the resistive random-access memory, mechanical reliability of the conventional stretchable materials (ultrathin wavy polyimide or non-healable viscoelastic materials) acting as a stretchable substrate has a problem of being vulnerable to long-term mechanical stresses originating from repetitive movement of various organs (e.g., skin, heart, tendons, and peripheral nerves).

In order to solve this problem, it is proposed to apply soft stretchable polymetric materials with high toughness and self-healing properties to electrodes and resistive switching materials of the resistive random-access memory devices.

Self-healing resistive random-access memory of the prior art may not be utilized as a resistive random-access memory since the filament structure inside the resistive random-access memory is not stable due to dynamic movement of polymer chains and volatility of reversible chemical bonds of self-healing polymers.

In addition, there is a problem in that development of memory devices capable of stably operating over a long period of time in a stretched environment is also limited.

DOCUMENTS OF RELATED ART (Patent Document 1) Korean Patent Registration No. 10-2020-0039304 A1

SUMMARY OF THE INVENTION

The present invention is proposed to solve these problems, and an object of the present invention is to provide a resistive random-access memory having stretchability and a self-healing function and a manufacturing method thereof, in which the resistive random-access memory has a characteristic of interaction between conducting fillers stronger than that of crosslinked polymers containing conducting fillers and polymers as a self-healing stretchable composite film with a concentration gradient of the metal powder is formed by mixing self-healing polymers and metal powders, in order to stably form electrically percolative pathways in organic and inorganic insulating materials and reversibly form a rupture process.

In addition, another object of the present invention is to provide a stretchable self-healing resistive random-access memory having stretchability and a self-healing function and a manufacturing method thereof, which can implement stable resistive switching in a dynamic molecular network by manufacturing the resistive random-access memory to have a metal composite bilayer with a concentration gradient of micro-metal or nano-metal that can easily form a metal-insulator-metal structure so that the characteristic of interaction between conducting fillers is stronger than that of the polymer for the sale of self-reorganization of nano-scale conducting fillers and formation of robust percolative pathways in dynamic hydrogen bonding for self-healing and reorganization.

In addition, another object of the present invention is to provide a stretchable self-healing resistive random-access memory and a manufacturing method thereof, which can successfully perform stable storage of data of cardiac signals, implement a damage-reliable memory trigger system using a triboelectric energy harvesting device, and carry out touch sensing through pressure-induced resistive switching or the like.

Another object of the present invention is to provide a stretchable self-healing resistive random-access memory and a manufacturing method thereof, which can stably implement memory performance in a stretched environment by adjusting distribution of silver micro or nano particles in the self-healing polymers by adjusting viscosity of volatile solvent and solution.

The technical problems to be solved by the present invention are not limited to the technical problems mentioned above, and unmentioned other technical problems can be clearly understood by those skilled in the art from the following description.

To solve the technical problems, in an embodiment of the present invention, there is provided a stretchable self-healing resistive random-access memory formed by stacking a self-healing stretchable composite film manufactured to have a metal composite bilayer, of which one side is formed as a conducting layer having abundant metal powder, and the other side is formed as an insulating layer, as it has a concentration gradient of micro- or nano-sized metal powder in the self-healing polymer, so that the insulating layer is bonded to the conducting layer.

The metal powder may have a size ranging from 1 nm to 999 μm.

The insulating layer may have a weight ratio of the self-healing polymer and the metal powder ranging from 1:20 to 20:1 to have the characteristics of a resistive random-access memory.

A solvent may be one or more selected from a group configured of Chloroform, Acetone, Hexane, Methanol, Ethanol, Isopropyl alcohol, Butanol, Tetrahydrofuran (THF), Dichloromethane, Toluene, Ether, Cyclohexane, Ethyl acetate, Methyl Isobutyl Ketone (MIBK), and Acetonitrile.

The insulating layer may have a thickness ranging from 1 nm to 1 mm to have the characteristics of a resistive random-access memory.

The insulating layer may have a resistance ranging from 10Ω to 99 TΩ to have the characteristics of a resistive random-access memory.

The metal forming the metal powder is one or more selected from a group configured of Ag, Au, Cu, Al, W, Mo, Ti, Cr, Pt, and Ni.

The self-healing polymer may include an elastomer material using, as a backbone, any one among polydimethylsiloxane (PDMS), polyethyleneoxide (PEO), Perfluoropolyether (PFPE), polybutylene (PB), poly(ethylene-co-1-butylene), poly(butadiene), hydrogenated poly(butadiene), poly(ethylene oxide)-poly(propylene oxide) block copolymer or random copolymer, and poly(hydroxyalkanoate).

The self-healing polymer may further include MPU (4,4'-methylenebis(phenyl urea) unit) or isophorone bisurea units (IU).

To solve the technical problems, in another embodiment of the present invention, there is provided a method of manufacturing stretchable self-healing resistive random-access memory, the method comprising the steps of: manufacturing a mixed solution of self-healing polymer and metal powder (S10); manufacturing a self-healing stretchable composite film in which a concentration gradient of metal powder is formed (S20); and manufacturing a resistive random-access memory (S30).

The metal powder at the step of manufacturing a mixed solution of self-healing polymer and metal powder (S10) may have a size ranging from 1 nm to 999 μm.

The metal forming the metal powder at the step of manufacturing a mixed solution of self-healing polymer and metal powder (S10) may be one or more selected from a group configured of Ag, Au, Cu, Al, W, Mo, Ti, Cr, Pt, and Ni.

The self-healing polymer at the step of manufacturing a mixed solution of self-healing polymer and metal powder (S10) may include an elastomer material using, as a backbone, any one among polydimethylsiloxane (PDMS), polyethyleneoxide (PEO), Perfluoropolyether (PFPE), polybutylene (PB), poly(ethylene-co-1-butylene), poly(butadiene), hydrogenated poly(butadiene), poly(ethylene oxide)-poly (propylene oxide) block copolymer or random copolymer, and poly(hydroxyalkanoate).

The self-healing polymer at the step of manufacturing a mixed solution of self-healing polymer and metal powder (S10) may further include MPU (4,4'-methylenebis(phenyl urea) unit) or isophorone bisurea units (IU).

The weight ratio of the self-healing polymer and the metal powder at the step of manufacturing a mixed solution of self-healing polymer and metal powder (S10) may range from 1:20 to 20:1, and the mixed solution of self-healing polymer and metal powder may be manufactured by mixing 0.01 to 10 g of the mixed solution of self-healing polymer and metal powder with 1 mL of solvent.

The step of manufacturing a self-healing composite film in which a concentration gradient of metal powder is formed (S20) may be a step of drying the mixed solution of self-healing polymer and metal powder, which is manufactured to have a viscosity of creating a concentration gradient of metal powder, onto a film so that a conducting layer area and an insulating layer area are formed when drying the solution.

The insulating layer formed on the self-healing composite film manufactured at the step of manufacturing a self-healing composite film in which a concentration gradient of metal powder is formed (S20) may have a thickness ranging from 1 nm to 1 mm to have the characteristics of a resistive random-access memory.

The insulating layer formed on the self-healing composite film manufactured at the step of manufacturing a self-healing composite film in which a concentration gradient of metal powder is formed (S20) may have a resistance ranging from 10Ω to 99 TΩ to have the characteristics of a resistive random-access memory.

The insulating layer formed on the self-healing composite film manufactured at the step of manufacturing a self-healing composite film in which a concentration gradient of metal powder is formed (S20) may have a weight ratio of the self-healing polymer and the metal powder ranging from 1:20 to 20:1 to have the characteristics of a resistive random-access memory.

The step of manufacturing a resistive random-access memory (S30) may be a step of manufacturing a resistive random-access memory by laminating the manufactured self-healing composite film so that the conducting layer side and the insulating layer side face each other.

DETAILED DESCRIPTION

Figure 1:
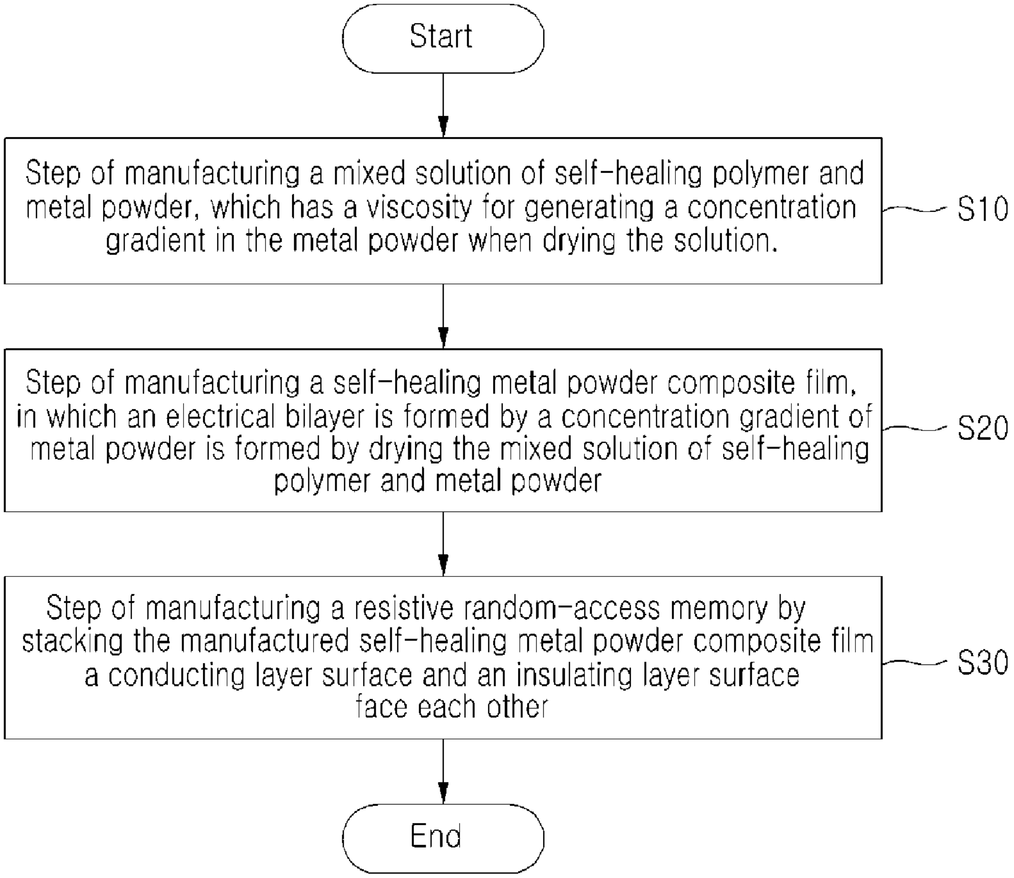
FIG. 1 is a flowchart illustrating the processing steps in a method of manufacturing a stretchable and self-healing resistive random-access memory according to an embodiment of the present invention.

Hereinafter, the present invention will be described with reference to the accompanying drawings. However, the present invention may be implemented in various different forms and is not limited to the embodiments described herein. In addition, in order to clearly explain the present invention in the drawings, parts that are not related to the description are omitted, and similar reference numerals are given to similar parts throughout the specification.

Throughout the specification, when a part is said to be "connected (coupled, contacted, combined)" with another part, this includes the cases of "indirectly connecting" the part to another part with intervention of another member therebetween, as well as the cases of "directly connecting" the parts. In addition, when a part "includes" a certain component, this does not mean that other components are excluded, but that other components may be added, unless specifically stated otherwise.

The terms used in this specification are used only to describe specific embodiments and are not intended to limit the present invention. Singular expressions include plural expressions unless the context clearly dictates otherwise. In this specification, it should be understood that terms such as "comprise" or "have" are intended to designate the presence of features, numbers, steps, operations, components, parts, or combinations thereof described in the specification, and are not intended to exclude in advance the possibility of presence or addition of one or more other features, numbers, steps, operations, components, parts, or combinations thereof.

Hereinafter, embodiments of the present invention will be described in detail with reference to the accompanying drawings.

FIG. 1 is a flowchart illustrating the processing steps in a method of manufacturing a stretchable and self-healing resistive random-access memory according to an embodiment of the present invention (hereinafter, referred to as "resistive random-access memory manufacturing method").

As shown in FIG. 1, the resistive random-access memory manufacturing method may be configured to include the steps of manufacturing a mixed solution of self-healing polymer and metal powder (S10), manufacturing a self-healing composite film in which a concentration gradient of metal powder is formed (S20), and manufacturing a resistive random-access memory (S30).

The step of manufacturing a mixed solution of self-healing polymer and metal powder (S10) may be a step of manufacturing a mixed solution of self-healing polymer and metal powder by mixing the self-healing polymer and the metal powder with a volatile solvent to have a viscosity for generating a concentration gradient in the metal powder so that a conducting layer area and an insulating layer area are formed when drying the solution.

At this point, the metal powder at the step of manufacturing a mixed solution of self-healing polymer and metal powder (S10) may have a size ranging from 1 nm to 999 μm.

The metal forming the metal powder at the step of manufacturing a mixed solution of self-healing polymer and metal powder (S10) may be one or more selected from a group configured of Ag, Au, Cu, Al, W, Mo, Ti, Cr, Pt, and Ni.

The self-healing polymer at the step of manufacturing a mixed solution of self-healing polymer and metal powder (S10) may include an elastomer material using, as a backbone, any one among polydimethylsiloxane (PDMS), polyethyleneoxide (PEO), Perfluoropolyether (PFPE), polybutylene (PB), poly(ethylene-co-1-butylene), poly(butadiene), hydrogenated poly(butadiene), poly(ethylene oxide)-poly (propylene oxide) block copolymer or random copolymer, and poly(hydroxyalkanoate).

The self-healing polymer at the step of manufacturing a mixed solution of self-healing polymer and metal powder (S10) may further include MPU (4,4'-methylenebis(phenyl urea) unit) or isophorone bisurea units (IU).

The weight ratio of the self-healing polymer and the metal powder at the step of manufacturing a mixed solution of self-healing polymer and metal powder (S10) may range from 1:20 to 20:1, and the mixed solution of self-healing polymer and metal powder may be manufactured by mixing 0.01 to 10 g of the mixed solution of self-healing polymer and metal powder with 1 mL of solvent.

The solvent may be one or more selected from a group configured of Chloroform, Acetone, Hexane, Methanol, Ethanol, Isopropyl alcohol, Butanol, Tetrahydrofuran (THF), Dichloromethane, Toluene, Ether, Cyclohexane, Ethyl acetate, Methyl Isobutyl Ketone (MIBK), and Acetonitrile.

The step of manufacturing a self-healing composite film in which a concentration gradient of metal powder is formed (S20) may be a step of drying the mixed solution of self-healing polymer and metal powder, which is manufactured to have a viscosity of creating a concentration gradient of metal powder, onto a film so that a conducting layer area and an insulating layer area are formed when drying the solution.

The insulating layer formed on the self-healing composite film manufactured at the step of manufacturing a self-healing composite film in which a concentration gradient of metal powder is formed (S20) may have a thickness ranging from 1 nm to 1 mm to have the characteristics of a resistive random-access memory.

The insulating layer formed on the self-healing composite film manufactured at the step of manufacturing a self-healing composite film in which a concentration gradient of metal powder is formed (S20) may have a resistance ranging from 10Ω to 99 TΩ to have the characteristics of a resistive random-access memory.

The insulating layer formed on the self-healing composite film manufactured at the step of manufacturing a self-healing composite film in which a concentration gradient of metal powder is formed (S20) may have a weight ratio of the self-healing polymer and the metal powder ranging from 1:20 to 20:1 to have the characteristics of a resistive random-access memory.

According thereto, a self-healing composite film having a bilayer can be manufactured, in which one side is formed as a conducting layer having abundant metal powder, and the other side is formed as an insulating layer having scarce metal powder, and the insulating layer is formed as thick as to have the characteristics of a resistive random-access memory.

The self-healing composite film may provide a self-healing function when a memory damaged by an external force is in contact for a predetermined period of time.

The step of manufacturing a resistive random-access memory (S30) may be a step of manufacturing a resistive random-access memory by laminating the manufactured self-healing composite film so that the conducting layer side and the insulating layer side face each other.

Figure 2:
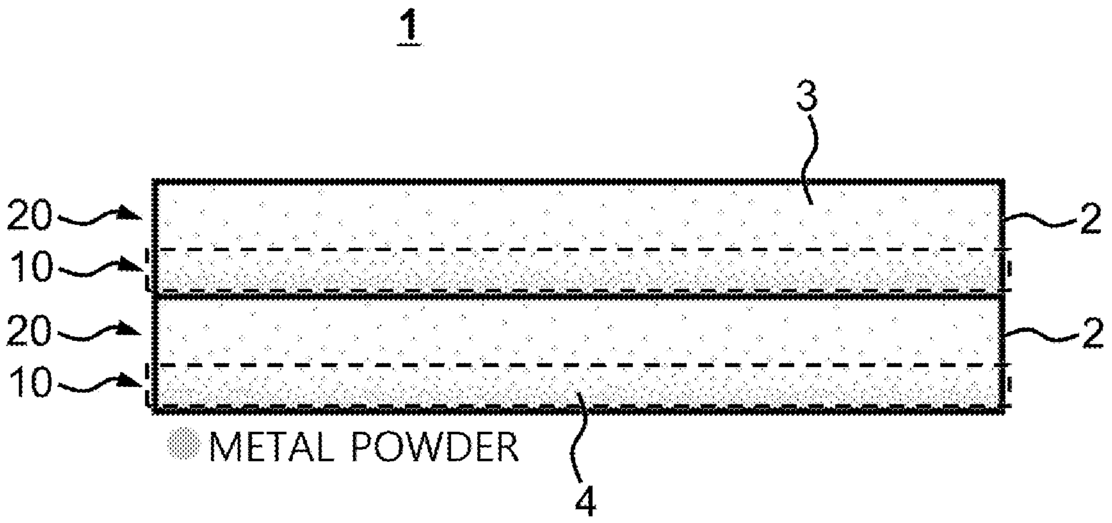
FIG. 2 is a cross-sectional view showing a stretchable and self-healing resistive random-access memory according to an embodiment of the present invention.

FIG. 2 is a cross-sectional view showing a stretchable and self-healing resistive random-access memory 1 according to an embodiment of the present invention.

As shown in FIG. 2, the stretchable and self-healing resistive random-access memory 1 may be formed by stacking a self-healing composite film manufactured to have a metal composite bilayer, of which one side is formed as a conducting layer 10 having abundant metal powder, and the other side is formed as an insulating layer 20, as it has a concentration gradient of micro- or nano-sized metal powder in the self-healing polymer 3, so that the insulating layer 20 is bonded to the conducting layer 10.

In the resistive random-access memory of the present invention, the self-healing composite film is manufactured by dissolving self-healing polymer and micro- or nano-sized metal powder in a volatile solvent, and then pouring and drying the dissolved solution. At this point, distribution of the metal powder inside the self-healing composite film varies according to the amount of the volatile solvent. It may function as a resistive random-access memory only when the amount of volatile solvent is adequate as to gradually increase distribution of the metal powder in the self-healing composite film.

The metal powder may have a size ranging from 1 nm to 999 μm.

The insulating layer may have a thickness ranging from 1 nm to 1 mm to have the characteristics of a resistive random-access memory.

The insulating layer may have a resistance ranging from 10Ω to 99 TΩ to have the characteristics of a resistive random-access memory.

The insulating layer may have a weight ratio of the self-healing polymer and the metal powder ranging from 1:20 to 20:1.

Figure 3:
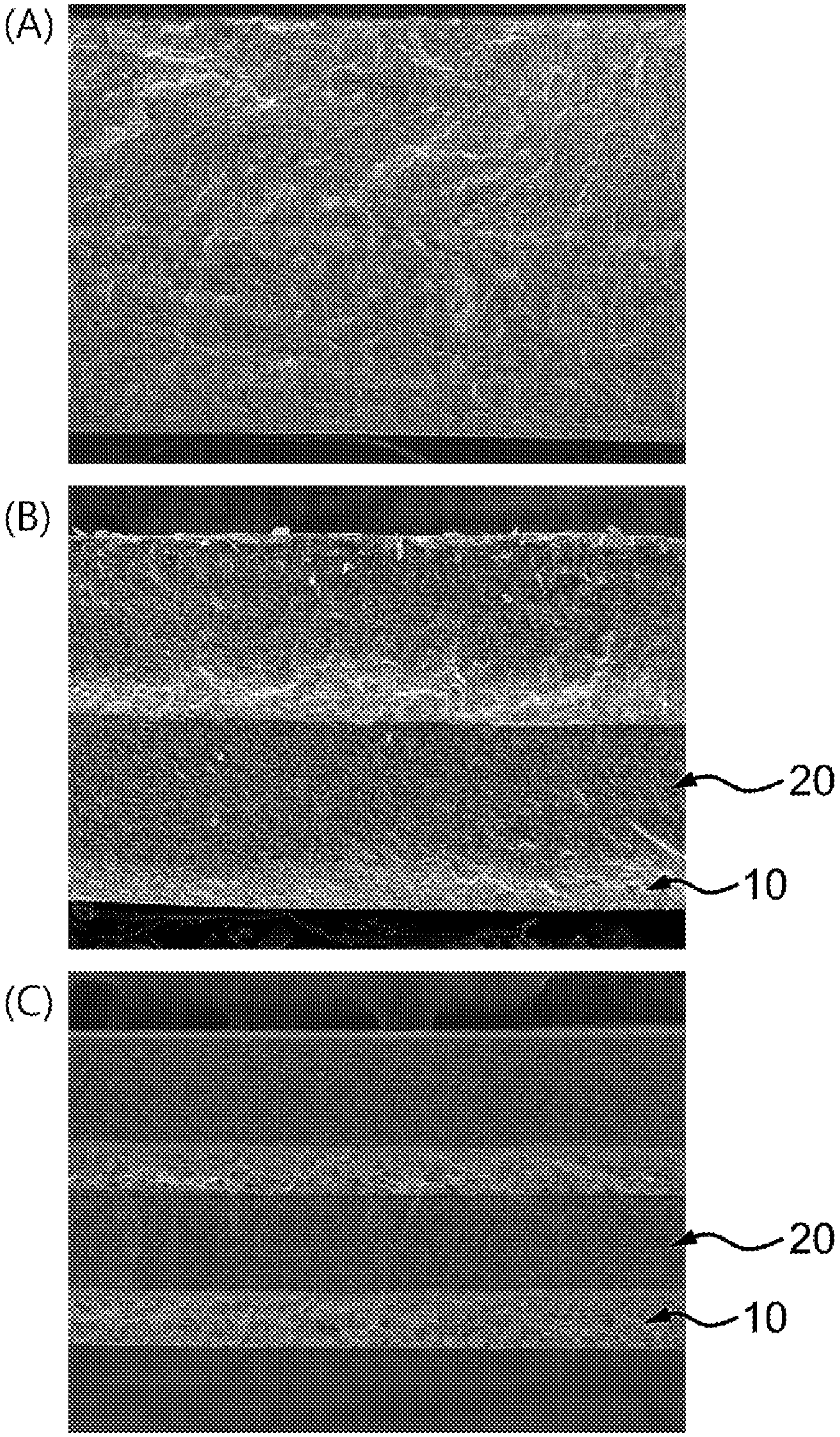
FIG. 3 is a view showing SEM images of a stretchable and self-healing resistive random-access memory fabricated using a mixture of self-healing polymer and metal powder (Ag powder) having different viscosities ((a) high viscosity, (b) medium viscosity, and (c) low viscosity) by applying the method of manufacturing a resistive random-access memory of FIG. 1.

FIG. 3 is a view showing SEM pictures of a stretchable and self-healing resistive random-access memory fabricated using a mixture of self-healing polymer and Ag powder having different viscosities ((a) high viscosity, (b) medium viscosity, and (c) low viscosity) by applying the method of manufacturing a resistive random-access memory of FIG. 1.

FIG. 3(*a*) shows a case where viscosity of the mixed solution of self-healing polymer and Ag powder is very high, and it does not function as a conductive sustain-capacitor, but functions only as an electrode.

FIG. 3(*b*) shows a case where viscosity of the mixed solution of self-healing polymer and Ag powder is appropriate to form an Ag concentration gradient, showing that the characteristics of a resistive random-access memory are created.

FIG. 3(*c*) shows a case where viscosity of the mixed solution of self-healing polymer and Ag powder is too low, and the insulating layer acting as an insulating layer is too thick to function as a resistive random-access memory device.

Examples of Experiment

<Manufacturing of SS-RRAM>

As an example of the resistive random-access memory (RRAM) of the present invention, a self-healing stretchable resistive random-access memory (SS-RRAM) is manufactured in a method described below.

Aminopropyl terminated PDMS (Gelest, Mn=5000, 100 g) and chloroform (Samchun, 400 mL) are stirred at 0° C. in an $N_2$ atmosphere. After 1 hour, triethylamine (Sigma Aldrich, 10 mL) is added to the flask. After stirring for 1 hour, 4,4'-Methylenebis(phenyl isocyanate) (TCI, 2.0 g) and Isophoron diisocyanate (TCI, 2.7 g) are dissolved in chloroform (10 mL) and injected into the flask. After 30 minutes, the reaction temperature is gradually raised to room temperature, and the reaction is continued for four days. After the reaction, methanol (Samchun, 15 mL) is added to the flask and stirred for 30 minutes. The reaction flask is concentrated to a half, and 60 mL of methanol is added. After 30 minutes, the upper solution and viscous liquid are removed. 100 mL of chloroform is added and stirred to dissolve the generated material. Dissolution, precipitation, and decantation are repeated three times. The produced solution is concentrated in a vacuum evaporator and dried at room temperature for 2 days. Self-healing polymer (SHP) (2 g) is dissolved as is prepared in 10 mL of chloroform while stirring. After 30 minutes, 6 mL of chloroform is added to the SHP solution to lower the viscosity of the solution, and stirring is continued for 30 minutes. Then, AgF (silver flake) (5.8 g) is slowly added to 16 mL of SHP solution while stirring for 30 minutes. Then, the AgF-SHP solution is drop-cast on an octadecyltrimethoxysilane-functionalized silicon dioxide/silicon wafer substrate. After 1 day, in-situ formation of Ag nanoparticles around the AgF is completed. The assembled composite is an Ag-GN self-healing composite film (Ag-gradient micro or nano composites film). Since the Ag-GN self-healing composite film is free-standing, it can be separated from the handling wafer. The separated Ag-GN self-healing composite film is cut into two Ag-GN self-healing composite films using a razor blade. The conductive surface (bottom surface) of the first Ag-GN self-healing composite film is laminated on the insulating surface of the second self-healing composite film using the self-healing property at room temperature. The Ag-GN bilayer structure forms the SS-RRAM.

<Electrical Characteristics of SS-RRAM>

I-V measurements are conducted using a semiconductor analyzer (SCS-4200, Keithley) with tungsten probe tips (model: T20, straight needle shape, tip end diameter is 1 μm). A liquid metal (Gallium-Indium eutectic, Ga 75%, In 24.5%>99.99% trace metals basis, Sigma Aldrich) is used to measure the characteristics of the SS-RRAM using the tungsten tips to prevent undesired damage to the switching region of the SS-RRAM. The LABVIEW (National Instrument) program is customized to control the SCS-4200. Initially, the SS-RRAM is placed in the probe station (Tp-802x passive probe, trip). A DC bias is applied to the top electrode of the SS-RRAM while the bottom electrode is grounded. A compliance current of 500 μA is pinned to prevent undesired strong electrical breakdown or formation of irreversible filaments in the set process. In the reset process, the compliance current is limited to 0.1 A. During the durability or retention experiment, the resistance in the HRS and LRS is measured by applying voltages 0.4V and 0.15V to the conductive upper layer of the polymer, respectively.

<Reconstruction of Electrical Connection of AgF Particles in the Strained Self-Healing Polymer Matrix for Explaining Robust AgF (Ag Flake)-AgF Interaction>

Electrical dynamic reconstruction of Ag-GN is conducted using a stretching machine that includes a stretching stage having a step motor, a controller (SMC-100, Ecopia), and a laptop computer. An Ag-GN self-healing composite film (3 mm long, 3 mm wide, and 0.3 mm thick) is prepared to analyze the electrical dynamic reconstruction. The Ag-GN self-healing composite film is suddenly stretched up to 800% strain at a fast-stretching rate of 1 mm per second in order to electrically degrade the conductivity (for the formation of broken AgF aggregates). Then, the resistance value of the strained Ag-GN self-healing composite film is monitored, showing that the resistance of the Ag-GN self-healing composite film gradually decreases. Suchan electrical change originates from spontaneous reconstruction of Ag flakes (AgFs) in the strained SHP matrix.

<Nanoscale Current-Voltage Measurement>

Conductive atomic force microscopy is conducted through a customized AFM (Model: XE7, Park Systems) equipped with a source meter (Keithley 2410, Keithley) and a laptop computer. An Ag thin film is coated on an AFM cantilever (25pt-300B, Park Systems) using a sputter. The Ag-coated tip is contacted on the top of the Ag-GN self-healing composite film. The LABVIEW (national Instrument) program is customized to apply voltage through the source meter. In the current-voltage measurement, a positive bias is applied to the Ag-coated AFM tip, whereas the bottom of the Ag-GN self-healing composite film is grounded. The compliance current is set to 500 μA and 0.1 A in the setting and resetting operation, respectively.

<Experiment of Electrical Characteristic Change According to Self-Healing Region Under Horizontal Stretching Conditions>

Figure 8A:
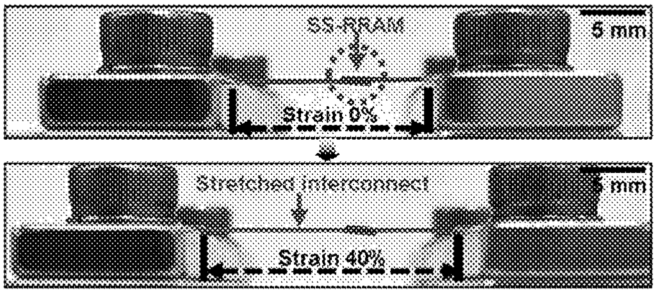
FIGS. 8A, 8B, 8C, 8D, 8E and 8F are views showing a result of analyzing the stretchable characteristics of SS-RRAM.
Figure 8B:
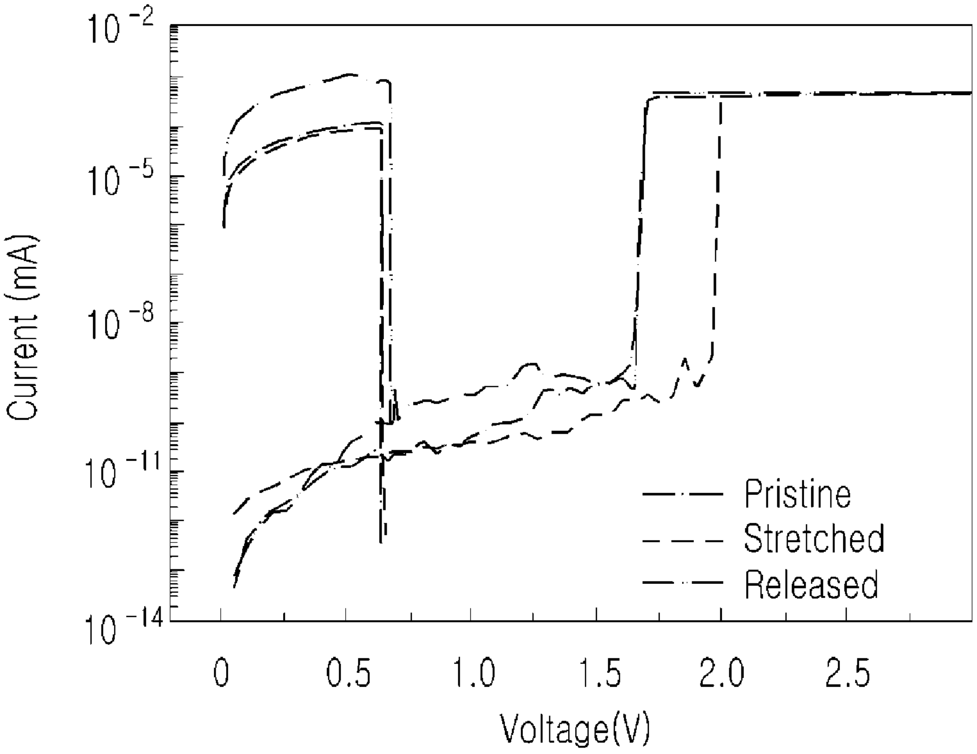
Figure 8C:
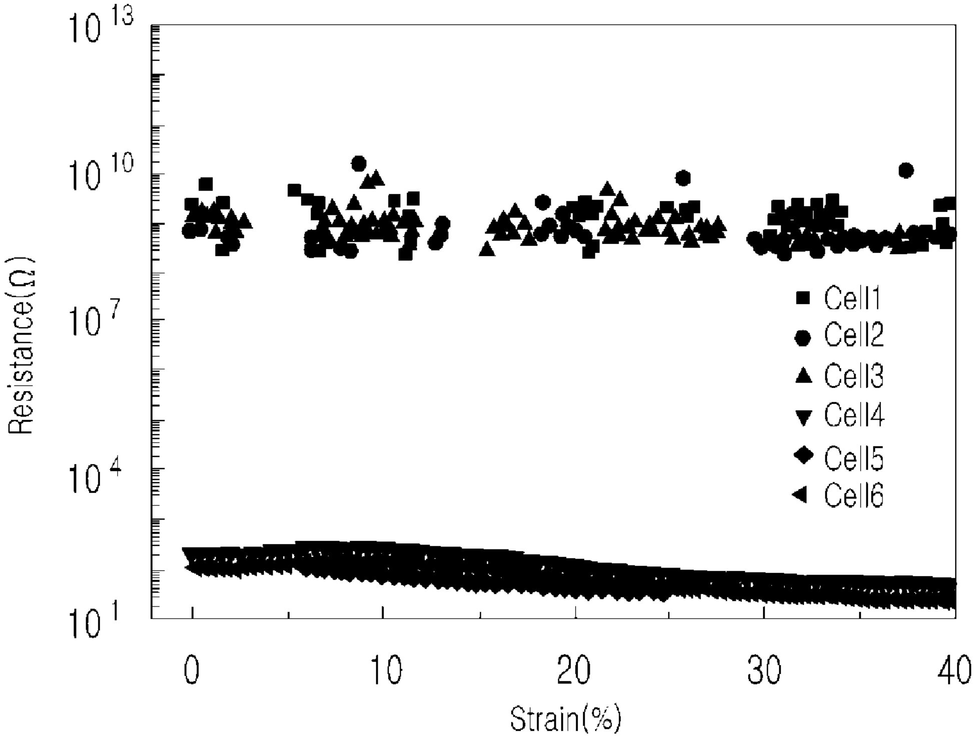

A stretching test is conducted on the SS-RRAM by applying a stretching speed of 6 μm/s to analyze electrical behaviors using a semiconductor analyzer (SCS-4200). To analyze the strain-dissipative effect of the SS-RRAM, an SS-RRAM with two long interconnects (total length of the interconnect: 15 mm, cell size: 1×1 $mm^2$) is prepared (FIGS. 8A to 8C). In addition, dependency of resistive switching performance of the SS-RRAM devices on the cell region is analyzed (FIGS. 8D to 8F, FIG. 9A). To confirm the intrinsic stretchability of the SS-RRAM, an SS-RRAM with short electrodes (total length: up to 18 mm, cell size: up to 1×15 $mm^2$) is also prepared.

<Experiment of Mechanical Compression>

A compression test is conducted using a compression and electrical measurement system. A step motor controller (SMC-100, Ecopia) and a force gauge (M2-10, Mark-10) are used to apply and measure a load to a single SS-RRAM cell (cell size: 5×5 $mm^2$). At the same time, resistance values are measured by applying a bias of 0.4V using a semiconductor analyzer (SCS-4200, Keithley) at different loads controlled by the LABVIEW program.

<Reconfiguration of 7×7 SS-RRAM Array Using Self-Healing Properties>

Individual 49 SS-RRAM cells of 7×7 array (the area of a single memory is 4×4 $mm^2$) are fabricated on a self-healing substrate. The 7×7 array is divided into six smaller arrays (2×2, 3×2, 3×3, and three 5×2). Individual SS-RRAM arrays are reconfigured into 4×5, 3×3, and 10×2 arrays through a self-healing process. The same strategy is used to combine the separated arrays as a 7×7 SS-RRAM device. The electrical characteristics of the reconfigured 7×7 SS-RRAM array are analyzed using a semiconductor analyzer (B1500A, Keysight).

Figure 4:
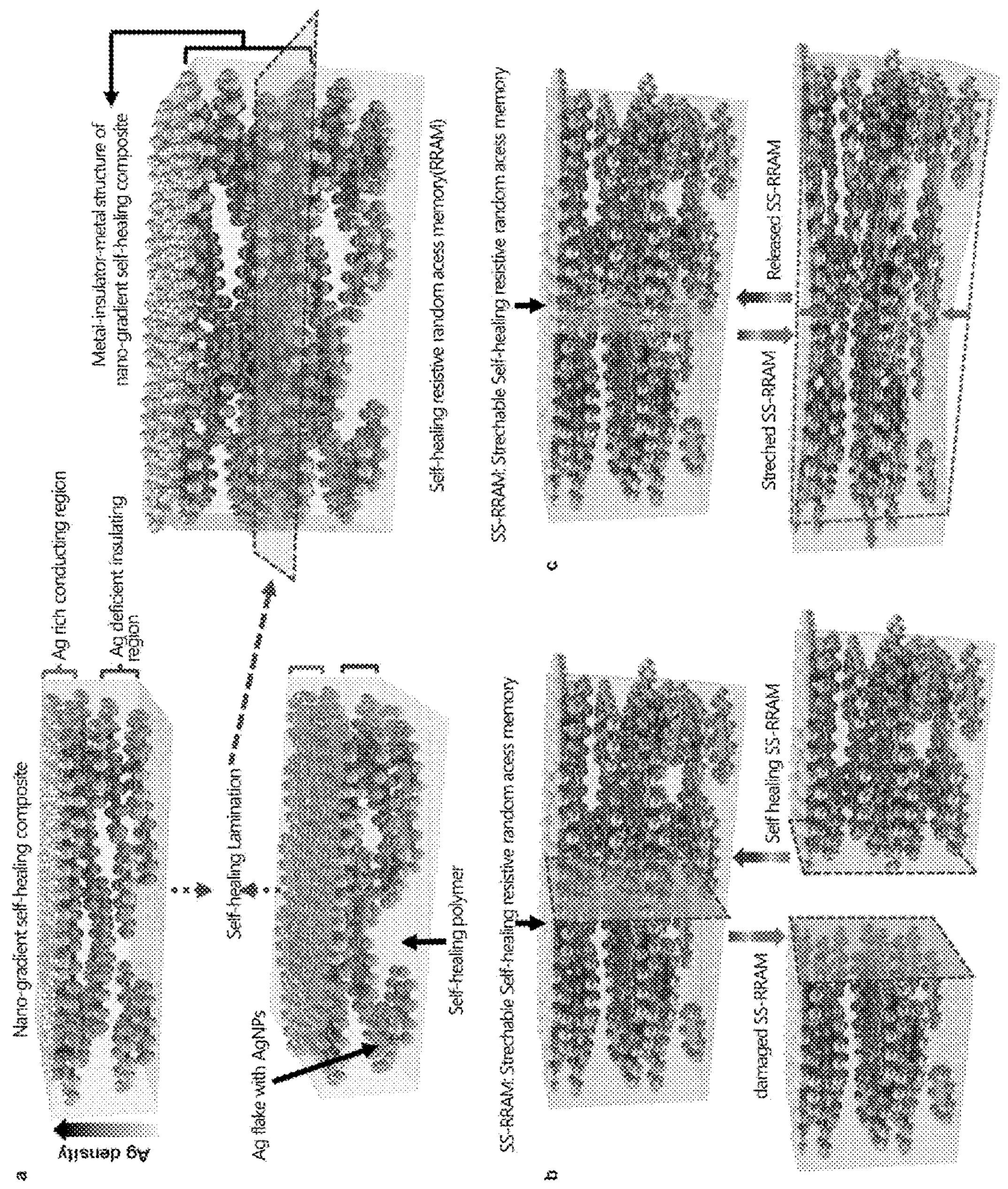
FIG. 4 is a view schematically showing the process of manufacturing a stretchable self-healing resistive random-access memory using self-healing characteristics and self-healing and stretching characteristics.
Figure 5:
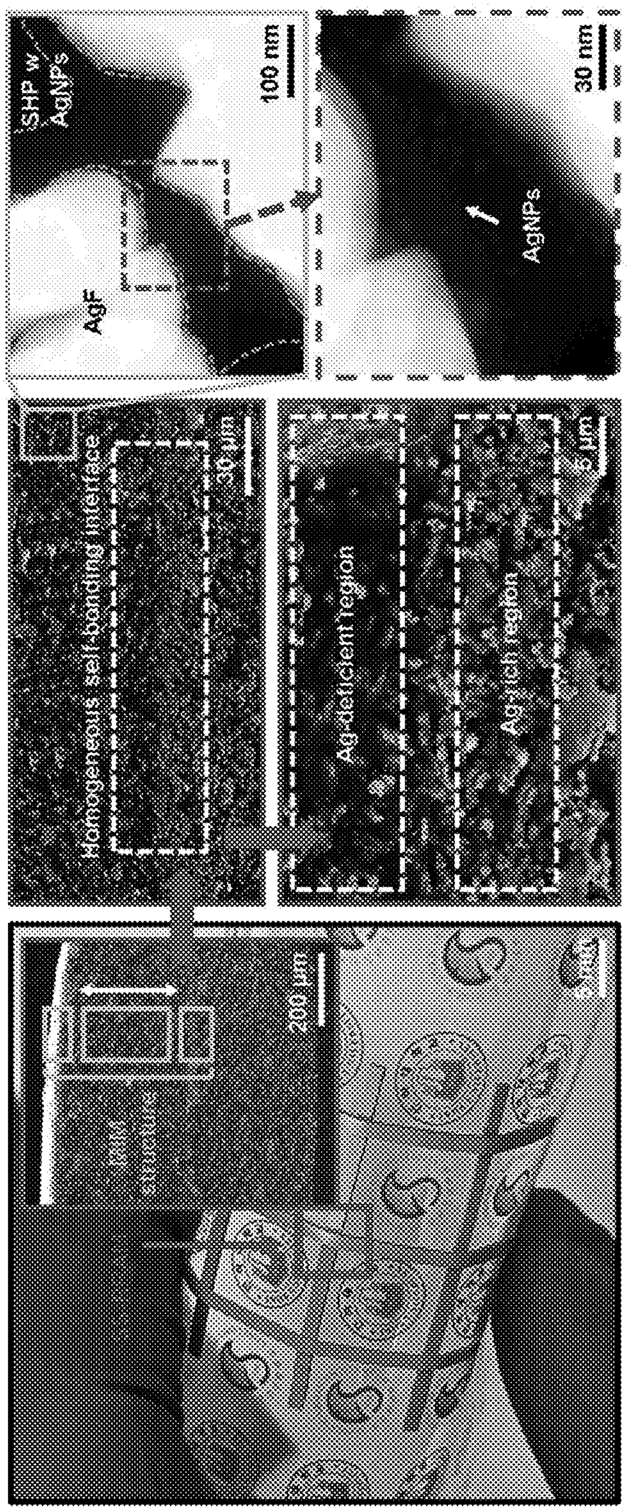
FIG. 5 is a view showing an image of an actual self-healing resistive random-access memory and SEM and TEM images of a silver particle gradient and distribution of nanoparticles.

FIG. 4 is a view schematically showing the process of manufacturing a stretchable self-healing resistive random-access memory using self-healing characteristics and self-healing and stretching characteristics, and FIG. 5 is a view showing an image of an actual self-healing resistive random-access memory and SEM and TEM images of a silver particle gradient and distribution of nanoparticles.

As shown in FIGS. 4 to 5, the Ag-GN self-healing composite film is configured of a tough self-healing stretchable polymer ((PDMS)-4,4'-methylenebis (phenylurea) $(MPU)_{0.4}$-isophorone bisurea units $(IU)_{0.6}$), and silver micro/nanoflakes (AgFs). The unique structure of the Ag-GN is a natural result of the drying process after drop-casting the AgF composite solution of appropriate viscosity onto the handling substrate. This asymmetric Ag distribution shows that the average resistance value (up to 10Ω) at the bottom is much lower than that at the top. AgFs tend to be concentrated and aggregated in the lower section of the Ag-GN self-healing composite film due to the density/interaction higher than those of the SHP in the solvent and the gravitational effect of the drying process. Compared to the in-plane conducting path in the upper section, the resistance value (up to 1 TΩ) at the vertical path between the upper and lower sections is also high, indicating that resistive switching occurs in the insulating region of the SS-RRAM. The SS-RRAM shows a typical unipolar resistance switching (URS) behavior, in which the high and low resistance states (HRS and LRS) are dominantly governed by Schottky emission/hopping and ohmic conduction mechanisms, respectively. In addition, the SS-RRAM has a high on/off ratio of up to $10^5$ (maximum-minimum ratio values of up to $10^5$ and $10^9$) and stable electrical durability (cyclic electrical endurance of 500 cycles and data retention of up to 50 hours), and may be stretched up to 100% strain even after the cutting/reconnecting process and heat-accelerated recovery (30 minutes at 60° C.). Based on the healing properties, the SS-RRAM may be used in reconfigurable modular electronic products, and may potentially realize user-customized electronic products. As a proof of concept, a reconfigurable device that can reconstruct a 1×4 array of the SS-RRAM into a 2×2 array without electrical malfunction has been demonstrated. In order to put an emphasis on the self-healing ability of the SS-RRAM, stable data storage of cardiac signals, a damage-reliable memory triggering system using a triboelectric nanogenerator (TENG), and touch sensing via pressure-induced resistive switching have been demonstrated.

<General Description of Self-Healing Stretchable Resistive Random-Access Memory (SS-RRAM)>

Intrinsically stretchable and self-healing insulating composite materials having resistive switching properties have not been reported yet due to the problems associated with the unstable formation and reformation of electrically percolative pathways inside the dynamic crosslinked networks. Realization of the intrinsically stretchable and self-healing resistive random-access memory device has prerequisite conditions as follows. The prerequisite conditions are (i) self-reconstruction of nanoscale conducting fillers in dynamically crosslinked polymers having a low glass-transition temperature ($T_g$), (ii) stronger interactions between individual conducting fillers rather than with polymers for robust formation of the percolative path (LRS), and (iii) an insulating layer in which the conducting fillers have an optimal density for precisely controlled resistive switching.

In order to meet these requirements, developed is an asymmetric structure comprising a self-healing stretchable Ag-GN self-healing composite film having both conducting and insulating interfaces as shown in FIG. 4*a*. The Ag-GN self-healing composite film is configured of Ag flakes (AgF) with in-situ formed Ag nanoparticles (AgNPs) and an SHP with low $T_g$.

Two prepared Ag-GN self-healing composite films are bonded through a self-healing process at room temperature to form a metal (M)-insulator (I)-metal (M) structure. As expected, the SS-RRAM is engaged in spontaneous healing and may also be intrinsically stretched owing to the dynamic multivalent hydrogen bonds and low $T_g$ of the SHP matrix (FIGS. 4*b* and *c*).

Cross-sectional scanning electron microscope (SEM) and transmission electron microscope (TEM) images of the SS-RRAM are shown in FIG. 5. The 3×3 SS-RRAM arrays are simply fabricated using the self-healing properties mentioned above. The enlarged SEM images show the asymmetric structure of the laminated Ag-GN bilayers. In addition, the TEM images show that AgNPs are formed around the AgF. Formation of the AgNPs contributes to the electron transport mechanism of the insulating polymer layer. This MIM structure may act as the SS-RRAM. In particular, resistive switching may occur in the Ag-deficient insulating region inserted between the top and bottom Ag-rich conducting layers. In addition, resistive switching under tensile stress may be stably performed by efficiently dissipating the strain energy of the Ag-GN cell itself and/or the interconnects.

Figure 6:
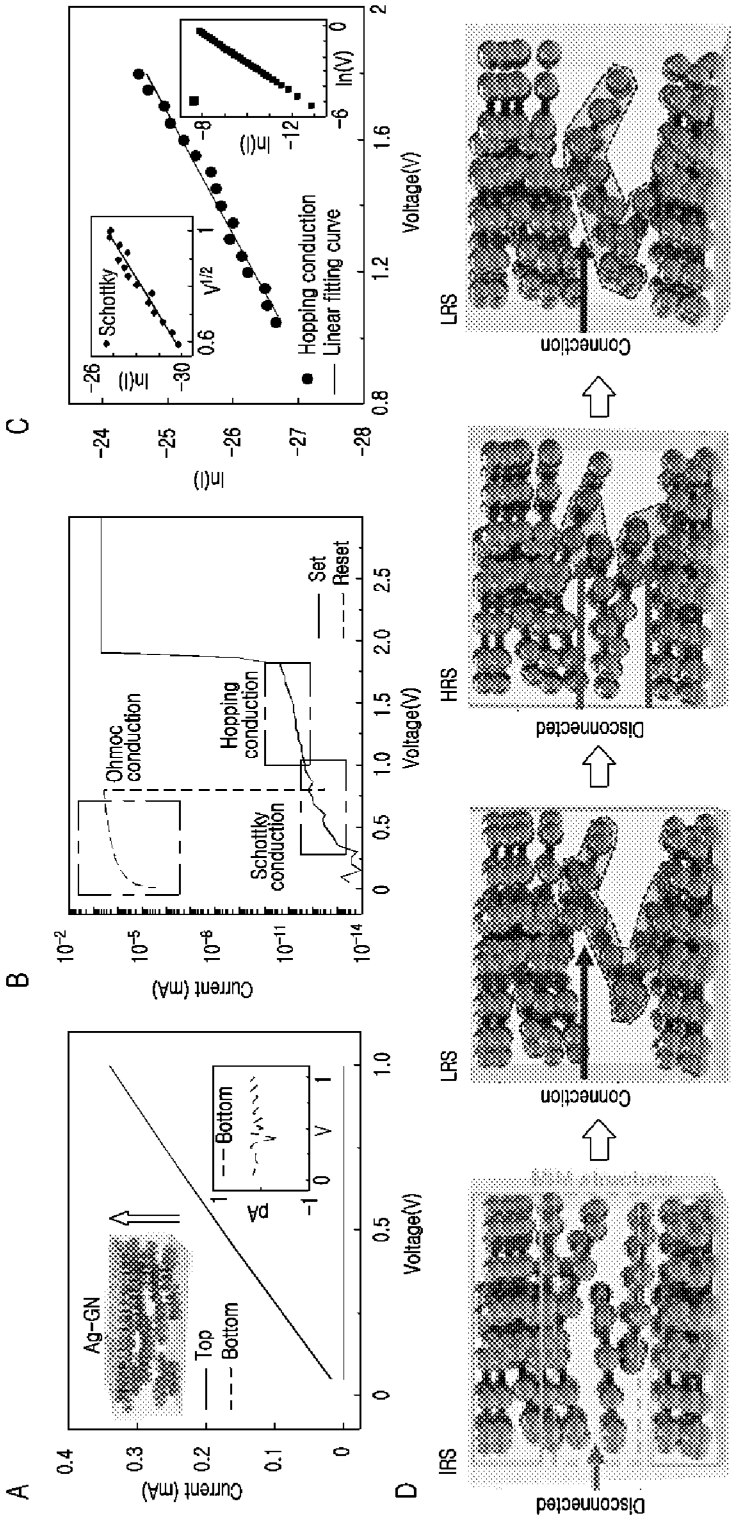
FIGS. 6 and 7 are views showing the electrical characteristics and conduction mechanism of a fabricated SS-RRAM.
Figure 7:
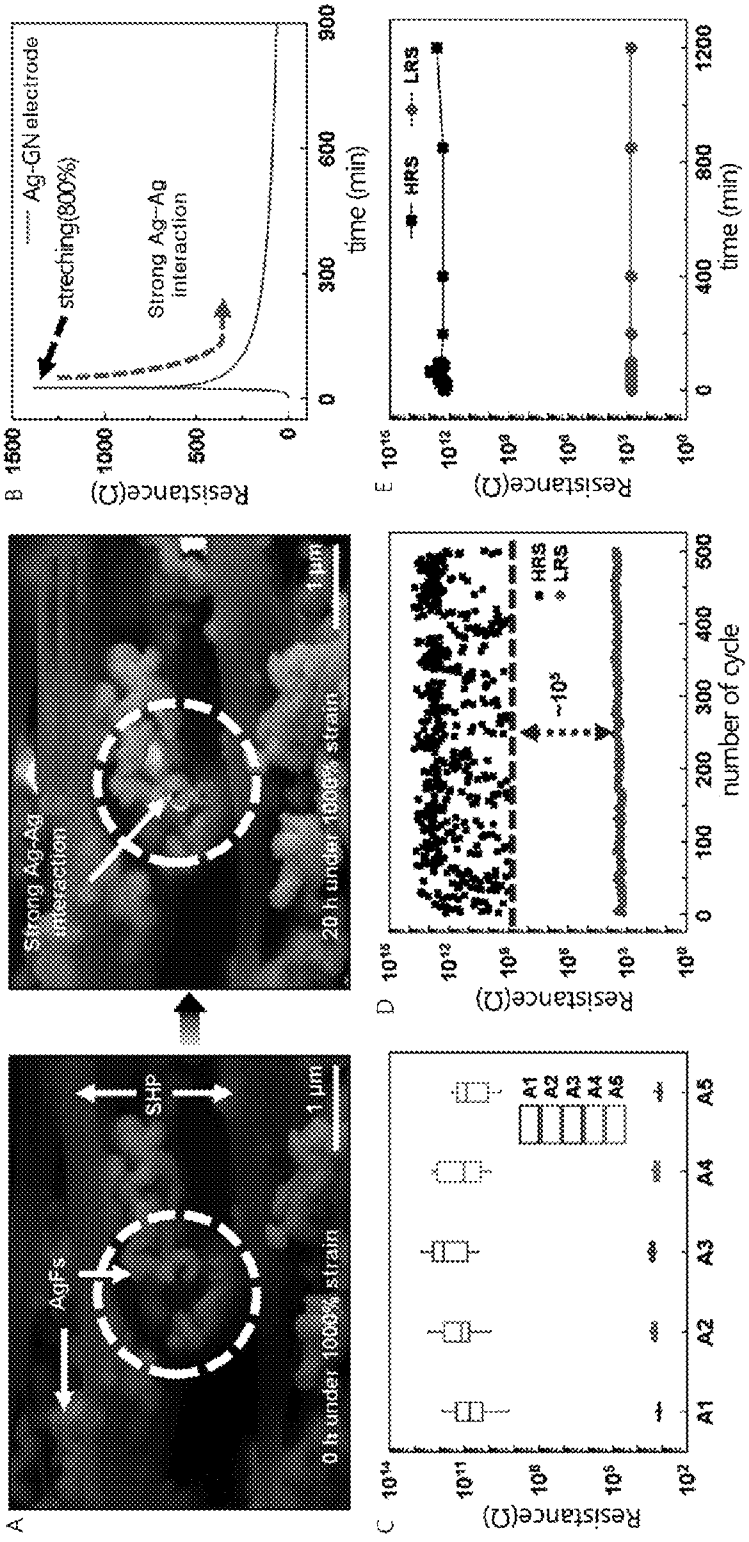

FIGS. 6 and 7 are views showing the electrical characteristics and conduction mechanism of the fabricated SS-RRAM.

<Observation and Durability of Unipolar Resistive Switching of SS-RRAM>

Current-voltage (I-V) measurements are conducted to investigate electrical behaviors in both Ag-rich and Ag-deficient regions of the Ag-GN (FIG. 6A). The upper Ag-rich region is highly conductive (a few ohms) and the Ag-deficient region is almost insulative (up to 1 TΩ). This structure confirms formation of asymmetric Ag-GN interfaces in the SS-RRAM when two Ag-GNs form a bilayer. The resistive switching of the SS-RRAM is studied by measuring the I-V characteristics. A positive step bias is applied to the Ag-rich conductive upper layer of the SS-RRAM while connecting the Ag-rich lower layer to the ground (see FIG. 4*a*).

The SS-RRAM shows atypical unipolar switching behavior as shown in FIG. 6B. A change from the HRS to the LRS ("Set") and a reversal from the LRS to the HRS ("Reset") are observed at 1.9 and 0.815V, respectively. To confirm the basic mechanism of the SS-RRAM conduction, current-voltage characteristics are analyzed. It is shown in the HRS of the SS-RRAM that the I-V curves mostly correspond to Schottky emission and hopping conduction. As shown in FIGS. 6B and 6C, the I-V data fits well with the $V^{1/2}$-ln(I) and V-ln(I) plots corresponding to the Schottky and hopping conduction mechanisms, respectively. The LRS of the SS-RRAM clearly shows ohmic conduction behaviors as expected. Based on the electrical analysis, a scenario possible for the resistive switching of the SS-RRAM is proposed (FIG. 6D). The as-fabricated SS-RRAM cell is initially in the HRS, showing that the AgFs are scattered and disconnected, together with the AgNPs in the Ag-deficient regions (FIG. 6D, step 1). In the HRS, prior to the Set process, charge transport is presumably initiated by Schottky emission and accelerated by hopping/tunneling conduction. When the DC bias is sufficient and reaches the set voltage, the disconnected AgFs and AgNPs in the resistive switching region of the Ag-GN bilayer may be physically connected by forming conductive filament paths (FIG. 6D, step 2).

In particular, it is found that the field-based formation of the conducting paths in the SS-RRAM is stably maintained even in the dynamic polymer matrix since the Ag—Ag interaction is much stronger than that of Ag-SHP. Resistance of the conductive filaments ranges from 0.1 to 4 kΩ. During the transition from the HRS to the LRS under the reset bias, the conductive filaments may be ruptured by the Joule heating process (FIG. 6D, step 3). When the set bias is applied to the SS-RRAM cells, broken paths can be reconnected (FIG. 6D, step 4). To support the assumption that the filamentary conduction path can be stable and maintained due to the strong Ag—Ag interaction, in-situ SEM analysis of the Ag-GN self-healing composite film (at 1000% strain) is demonstrated at 0 h (left SEM in FIG. 7A) and 20 h. (right SEM) under 1000% strain (right side of FIG. 7A). As direct evidence, this analysis means that the separated AgFs can be spontaneously aggregated to stably maintain the conducting paths in the SS-RRAM. Fourier transform infrared spectroscopy (FTIR) data shows that AgFs do not exhibit chemical reactions with the SHP.

In addition, when the Ag-GN self-healing composite film is suddenly stretched to 800% strain, it is observed that the increased resistance values are significantly decreased without any external stimulus (FIG. 7B). This reconstruction of AgFs in the SHP matrix also supports those suggested before. In addition, the I-V characteristics of the SS-RRAM with different cell areas are also investigated. As shown in FIG. 7C, the resistive switching performance of the SS-RRAMs does not depend on the size of corresponding cells. This result indicates that resistive switching of the SS-RRAM is highly related to formation of conducting filaments. In addition to the observation of the resistive switching of the SS-RRAM, electrical cyclic endurance (500 cycles) of the SS-RRAM is investigated to confirm the electrical durability (FIG. 7D).

The data retention performance (1,200 minutes) of the HRS and the LRS at room temperature is also reliable (FIG. 7E). Such thermal stability is fully compatible with long-term skin (37.5° C.) tissue interfacing.

To discuss importance of the spontaneous formation of the Ag-GN structure for the stable resistive switching operation in the SS-RRAM, the Ag density gradient structure-based SSRAM is compared to two different devices using two types of nanocomposites.

One is a spin-coated SHP thin film (thickness of the SHP film is controlled by stacking each of 1 to 3 layers using the self-healing property) sandwiched between the top and bottom Ag-GN electrodes. The other one is an excessively phase-separated AgF-rich/-deficient composite embedded in the top and bottom Ag-rich electrodes.

First, an insulating SHP thin film embedded in the electrodes is prepared. The fabrication process begins with spin-coating the SHP solution (1 g/$CHCl_3$ 10 ml) onto an OTS-functionalized $SiO_2$ wafer to form an ultrathin-insulating SHP film. After finalizing the drying process, the insulating SHP film is bonded to the surface of the Ag-rich composite electrode via its self-healing property. After detaching it from the handling wafer substrate, insulating/Ag-rich layers are mounted on the Ag-deficient composite electrode in the same manner. Thickness of the insulating SHP film may be controlled using the transfer-printing method described above. From the SEM images, it can be seen that thickness of the insulating film is in a range of 3.2, 6.3, and 9.2 μm. To confirm the feasibility of the three structures for the RRAM, current-voltage characteristics are analyzed. Even after applying 100V (for initiating the forming process) to individual cells, no electrical changes are observed.

Second, in comparison with the Ag-GN structure, an AgF-rich/-deficient composite with excessive phase separation is fabricated by reducing viscosity (7.2 g/$CHCl_3$ 20 ml). The fabricated layers are put together through the self-healing properties. In the current-voltage curve, any resistive switching characteristics cannot be found in comparison with that of the Ag-GN based SS-RRAM. Contrary to the low viscosity of the AgF composite solution, viscosity is increased (7.2 g/$CHCl_3$ 12 ml), and then the layered structure is fabricated to confirm the electrical functionality. Due to the high viscosity, AgFs are uniformly distributed. As the Ag particles are uniformly spread throughout the self-healing composite film, there is no distinction between the Ag-rich region and the Ag-deficient region like a short circuit state, and thus it is difficult to apply as a memory device. These control experiments fully support the importance of forming the Ag concentration gradient structure in the SS-RRAM.

In addition to the comparative study of the Ag-GN structure with other structures, areal and batch-to-batch uniformity of the SS-RRAM devices fabricated via the drop-casting process is confirmed. First, resistance values of the HRS and the LRS are evaluated in 25 SS-RRAM cells. The cumulative distribution shows that each resistance state of the SS-RRAM devices is uniform. In addition, its variation is negligible. Second, three different 4-inch wafer-scale composite batches are prepared, and their electrical characteristics are analyzed. The resistive switching performances are almost identical, showing that the fabrication process is reliable.

Figure 9:
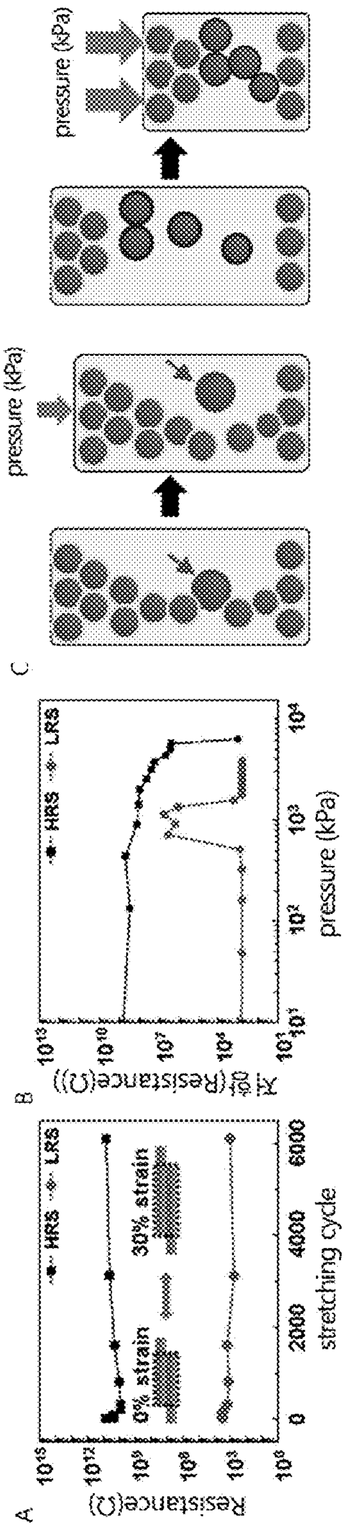
FIG. 9 is a view showing the characteristics of a self-healing resistive random-access memory according to pressure.
Figure 10A:
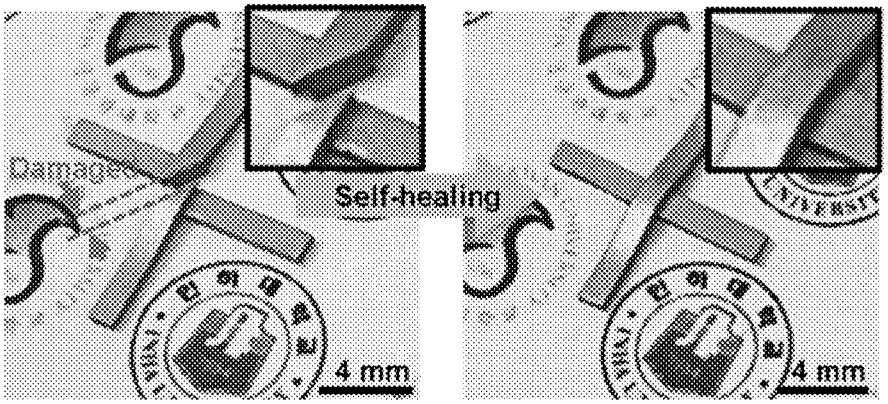
FIGS. 10A, 10B, 10C, 10D, 10E and 10F are views showing a result of observing memory characteristics under the applied tensile stress before and after self-healing.
Figure 10B:
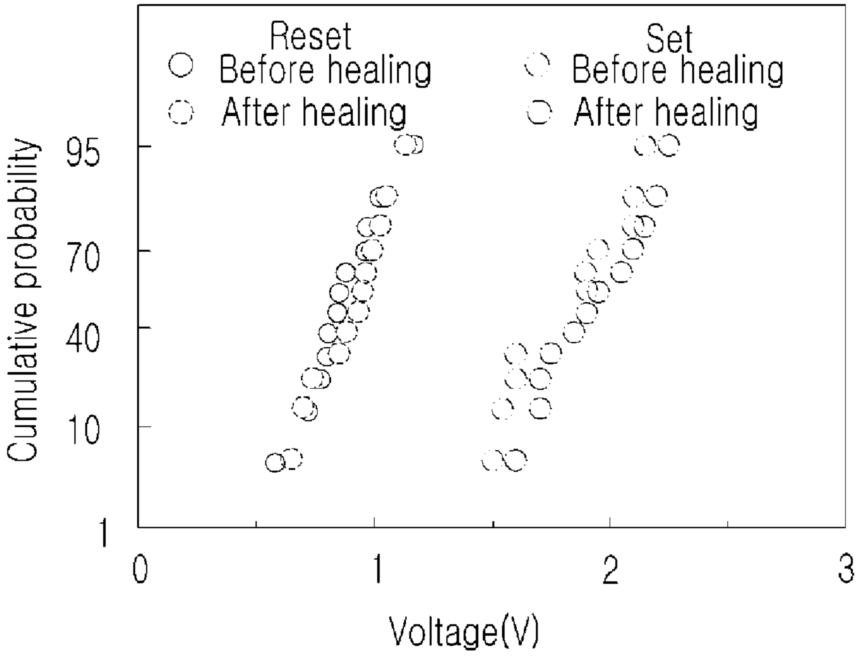
Figure 10C:
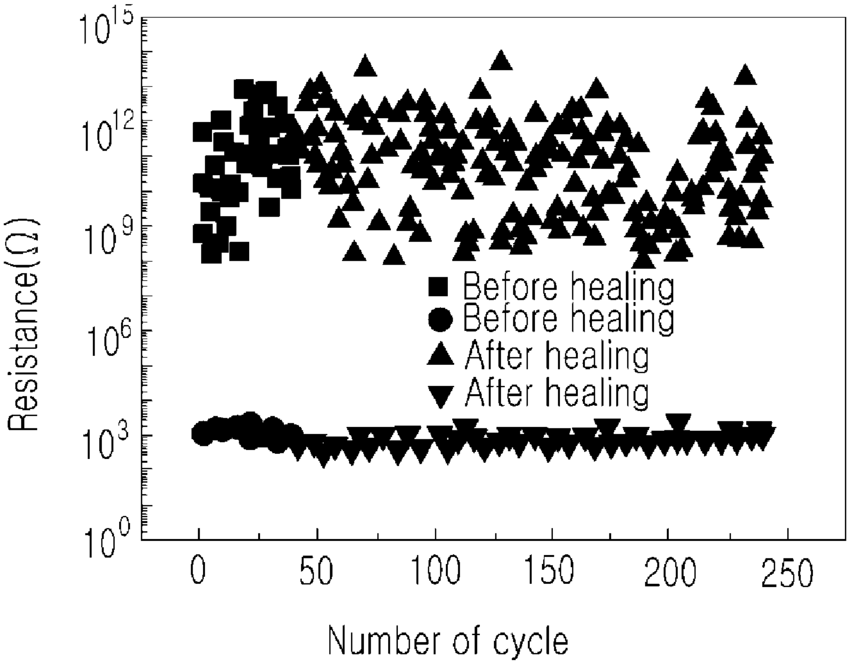
Figure 10D:
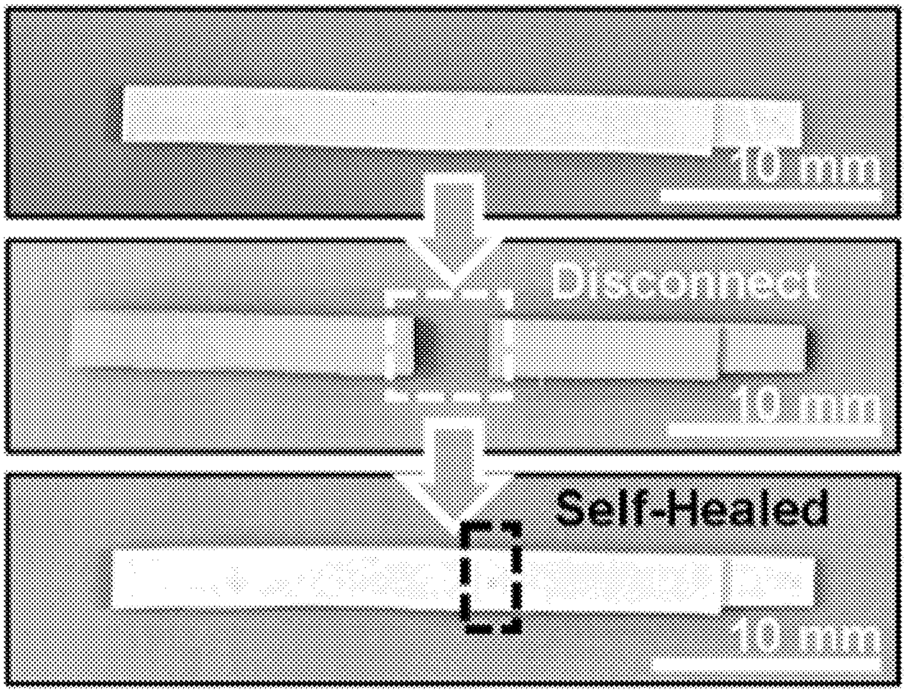
Figure 10E:
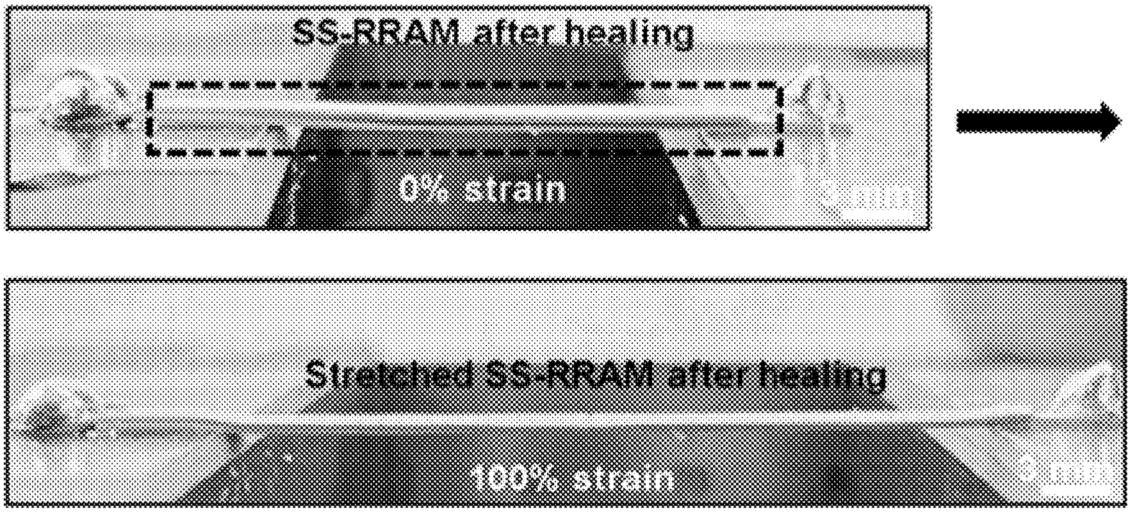
Figure 10F:
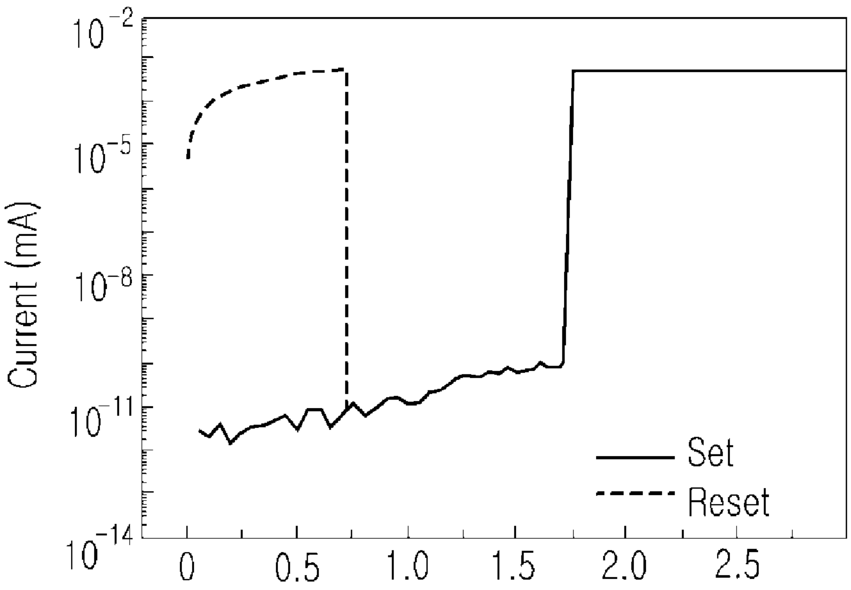
Figure 11A:
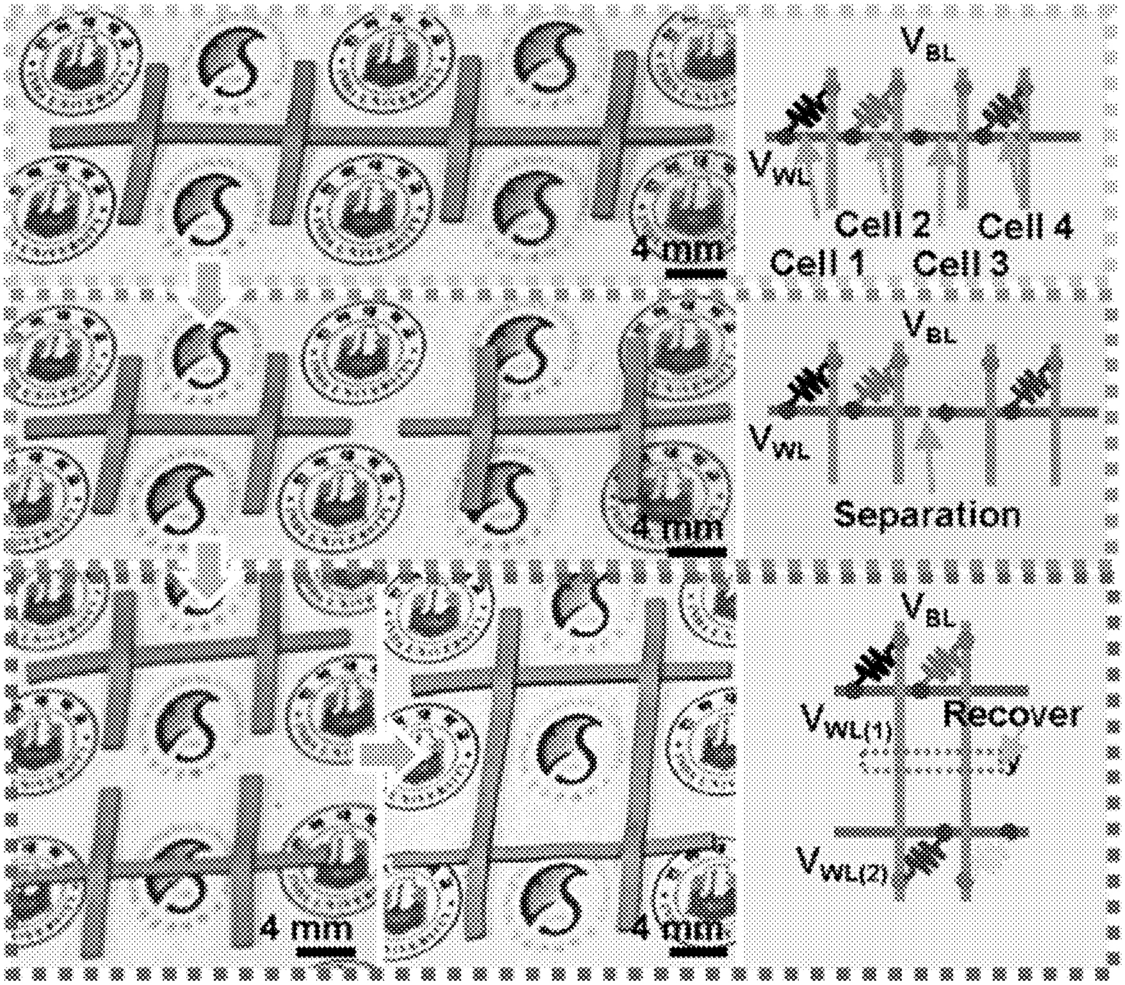
FIG. 11A is a view showing a result of a modular operation that is capable of changing a resistive random-access memory manufactured in a 1×4 form to a 2×2 form using self-healing characteristics.
Figure 11B:
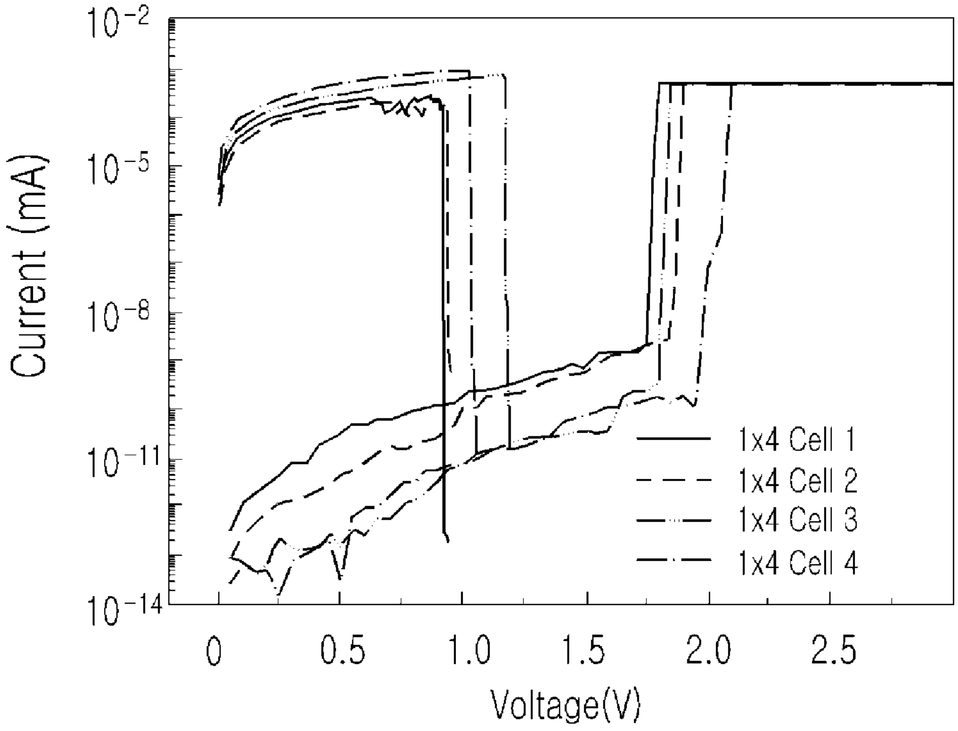
FIGS. 11B, 11C and 11D are views showing a result of a modular operation that is capable of changing a resistive random-access memory manufactured in a 1×4 form into a 2×2 form using self-healing characteristics, and comparing the characteristics.
Figure 11C:
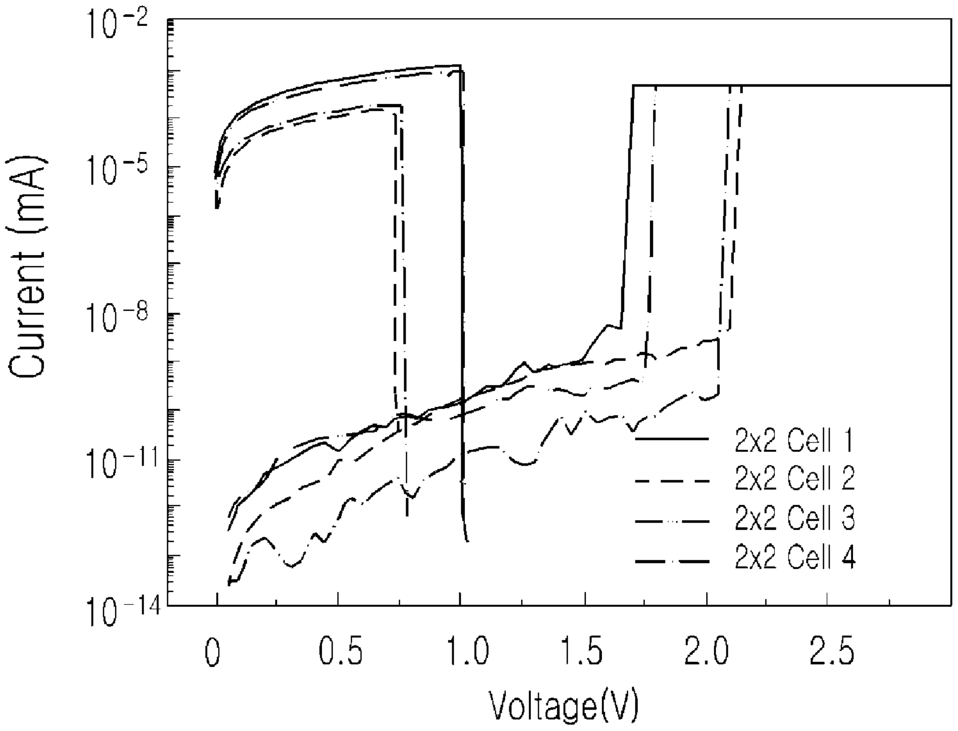
Figure 11D:
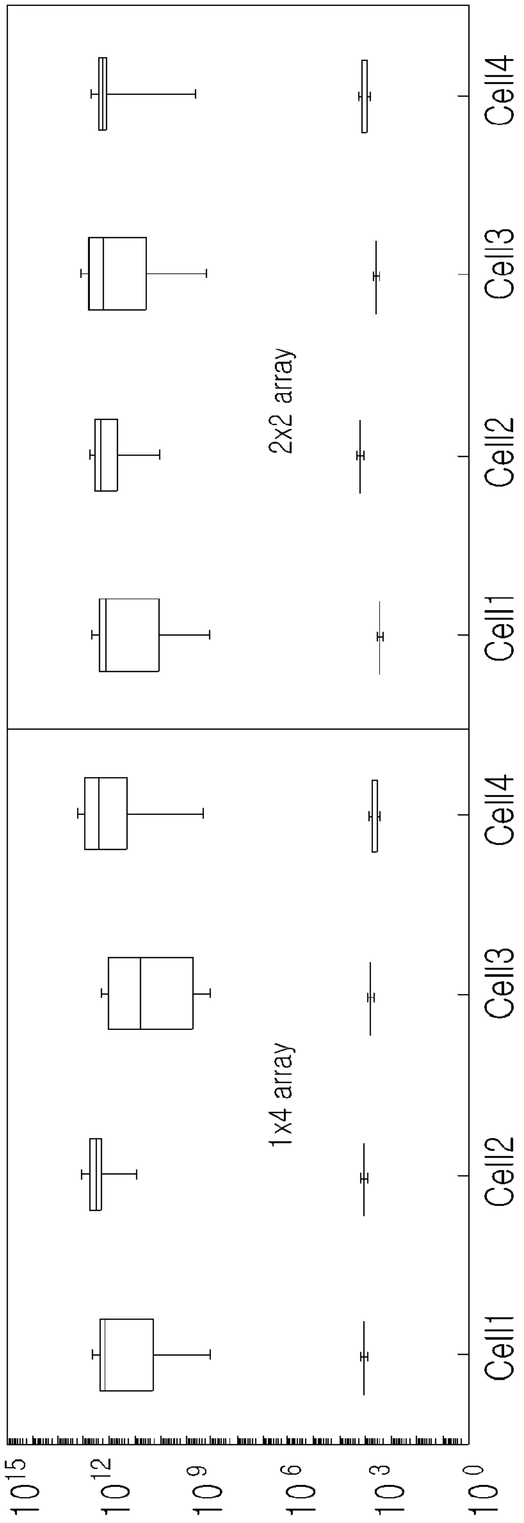

FIGS. 8A, 8B, 8C, 8D, 8E and 8F are views showing a result of analyzing the stretchable characteristics of SS-RRAM. FIG. 9 is a view showing the characteristics of a self-healing resistive random-access memory according to pressure. FIGS. 10A, 10B, 10C, 10D, 10E and 10F are views showing a result of observing memory characteristics according to tension before and after self-healing. FIG. 11A is a view showing a result of rendering a resistive random-access memory manufactured in a 1×4 form into a 2×2 form using self-healing characteristics. FIGS. 11*b*, 11*c* and 11*d* are views showing a result of rendering a resistive random-access memory manufactured in a 1×4 form into a 2×2 form using self-healing characteristics, and comparing the characteristics.

<Stretchability of SS-RRAM>

The SS-RRAM should exhibit stable resistive switching even under tensile stress or when it is exposed to unexpected mechanical stimuli damages. The intrinsic stretchability of the SS-RRAM cell is confirmed by stretching the SS-RRAM cell until the strain reaches 40% while measuring the I-V characteristics (FIGS. 8A and 8B). The individual URS curves are observed uniform in the pristine, stretched, and released states (FIG. 8C). In the subsequent investigations, stable retention performance of the HRS and the LRS is included in six different SS-RRAM cells (cells 1 to 3 correspond to the HRS; cells 4 to 6 indicate LRS) (FIG. 8B). Although the SS-RRAM shows reliable stretchability, most of the strain occurs in the interconnect area (FIG. 8A). In other words, the strain-dissipative property of the Ag-GN interconnect and the robust homogeneous self-bonded interface of the SS-RRAM are much more stable.

Figure 8D:
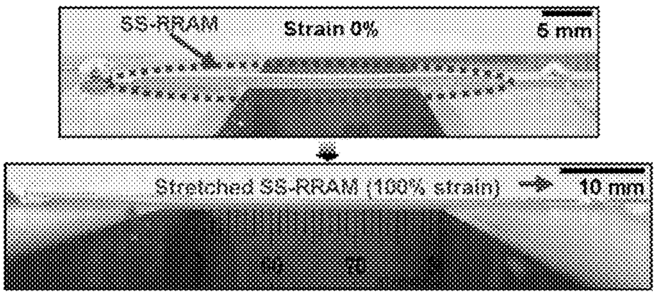
Figure 8E:
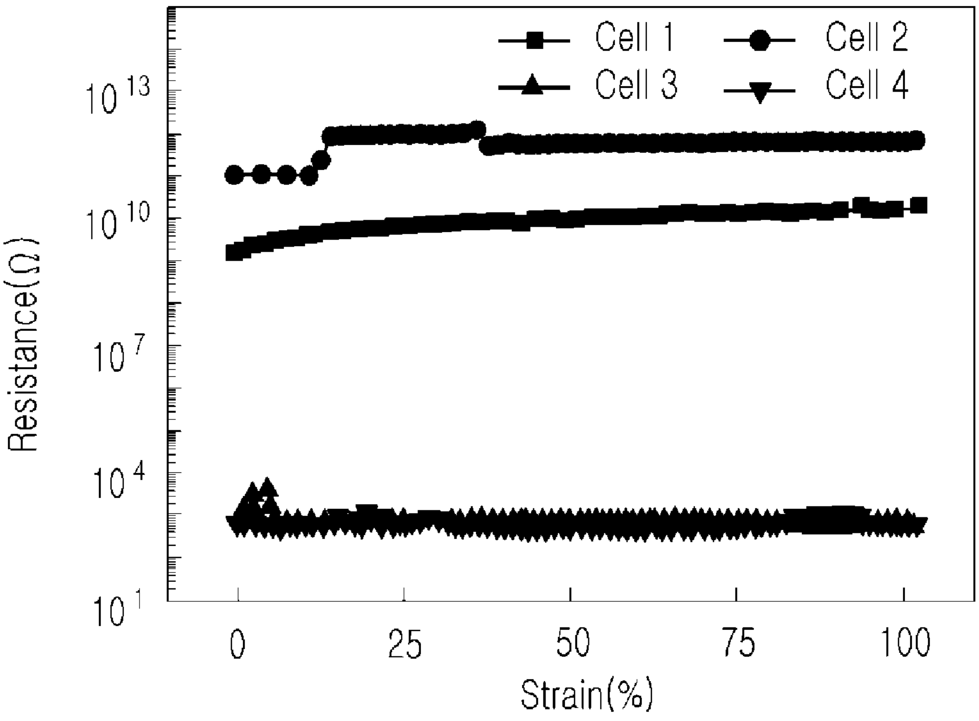
Figure 8F:
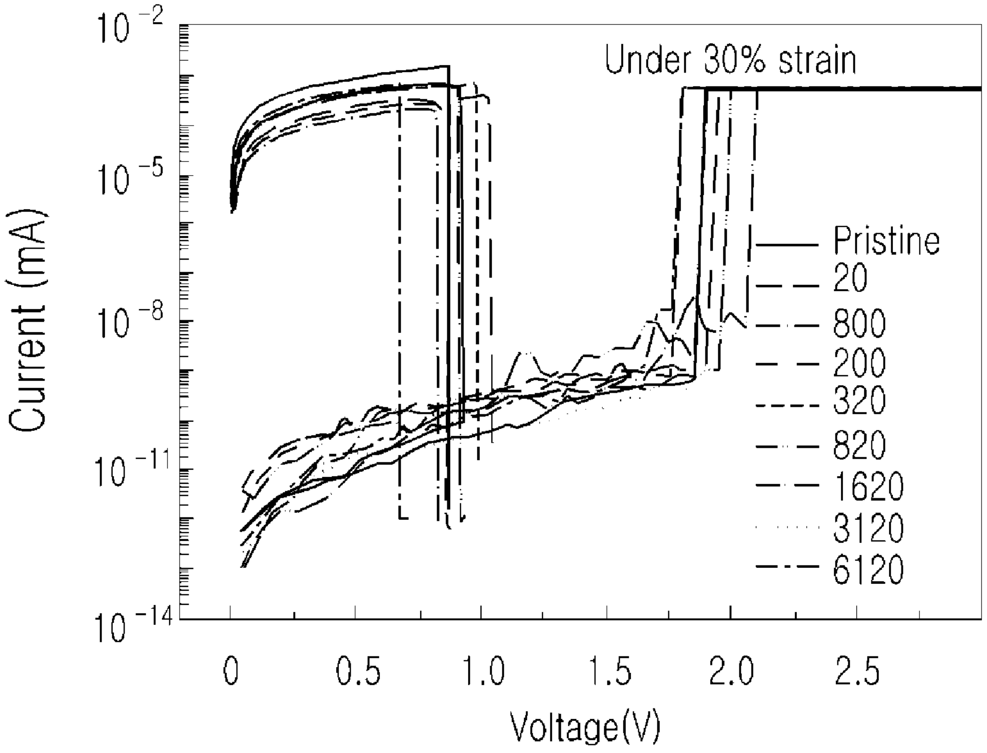

To clarify the intrinsic stretchability of the SS-RRAM without the strain-dissipative effects of the interconnect, resistive switching characteristics of the four different SS-RRAM devices with fully overlapped resistive switching areas are analyzed (FIGS. 8D and 8E). FIG. 8E shows that the LRS and the HRS of the SS-RRAM devices are maintained while gradually increasing strain values up to 100%. The resistive switching of the SS-RRAM is stable even during the stretching cyclic test (more than 6,000 cycles at a tensile strain of 30% only in the cell region) (FIG. 9A). Stretchability of the soft SS-RRAM is enough to be applied to a skin-like data storage device or a neuromorphic system. Since volatility of mechanical deformation of the conventional RRAM has been a problematic issue in realizing stretchable and wearable RRAMs, it is important to analyze electrical behaviors of the SS-RRAM under mechanical compression. FIG. 9B shows retention of LRS and HRS SS-RRAMs under the mechanical compression on the cell region. Both the LRS and HRS SS-RRAMs start to be affected by relatively high enough values of compression, and resistive switching occurs. In the case of the LRS, it is shifted first to the HRS at up to 512 kPa, lasts at the HRS up to 1,344 kPa, and comes back to the LRS from 1,560 kPa due to the highly compressed spatial structure. The SS-RRAM is based on a conduction path of filaments. The aligned AgFs of the LRS is compressed, and some AgFs may get out of the filament conduction path formed by mechanical compression. Finally, the scattered AgFs are reconnected in a high compression regime (FIG. 9C). On the other hand, resistance of the HRS gradually decreases and finally shifts to the LRS at 6,200 kPa. Gradual decrease of the resistance at the pressure of 1,000 kPa can be explained by the deviation of distance among the AgFs and the AgNPs, and this results in increase of hopping electric current. The final switching of the HRS to the LRS is occurred by percolative physical contact of the AgFs in a limited spatial structure driven by extreme compression.

In the case of the HRS, it does not show any failure up to the strain of 300%. Considering compression results, it would last the internal pressure up to 6,200 kPa, which is a much higher value than the one induced from the stretching.

Aside from the intrinsic stretchability of the SS-RRAM, self-healing ability is also important for skin-like memory devices or artificial synaptic devices. FIG. 10A shows the self-healing ability of a damaged SS-RRAM under a thermally accelerated condition (60° C.) for 30 minutes. Herein, self-healing performance through thermal actuation may be effectively accelerated without performance degradation. After the self-healing process, the I-V curves of the SS-RRAM devices before and after the self-healing process are almost the same. In addition, statistical distributions of the Set and Reset bias for 12 SS-RRAM cells before and after the self-healing process are confirmed to be uniform (FIG. 10B). The electrical cyclic endurance test for examining durability of the SS-RRAM (FIG. 10C) does not reveal any significant change in the LRS and the HRS of the SS-RRAM before and after the healing process while the on/off ratio is maintained stably. In addition, after the healing process, the SS-RRAM is stably stretched up to 100% strain while showing identical resistive switching performance (FIGS. 10D to 10F).

Owing to the self-healing function, configuration of the memory array may be reconfigured in response to an instant demand. The images and corresponding circuit diagrams show three types (a 1×4 array in the first row, two 1×2 arrays in the second row, and a 2×2 array in the third row) of SS-RRAM crossbar arrays (FIG. 11A). The facile reconfiguration capability originates from the self-healing property of the SS-RRAM. The electrical properties of the SS-RRAM array are confirmed by conducting a statistical analysis on the I-V curves of the 1×4 and 2×2 SS-RRAM arrays (FIGS. 11B to 11D).

All the resistive switching data of the arrays before and after the reconfiguration are similar to those of individual SS-RRAM cells. This result means that a simple approach of constructing a crossbar array structure may be used and the array can be reconstructed in response to an instant demand through the self-healing function.

Figure 12:
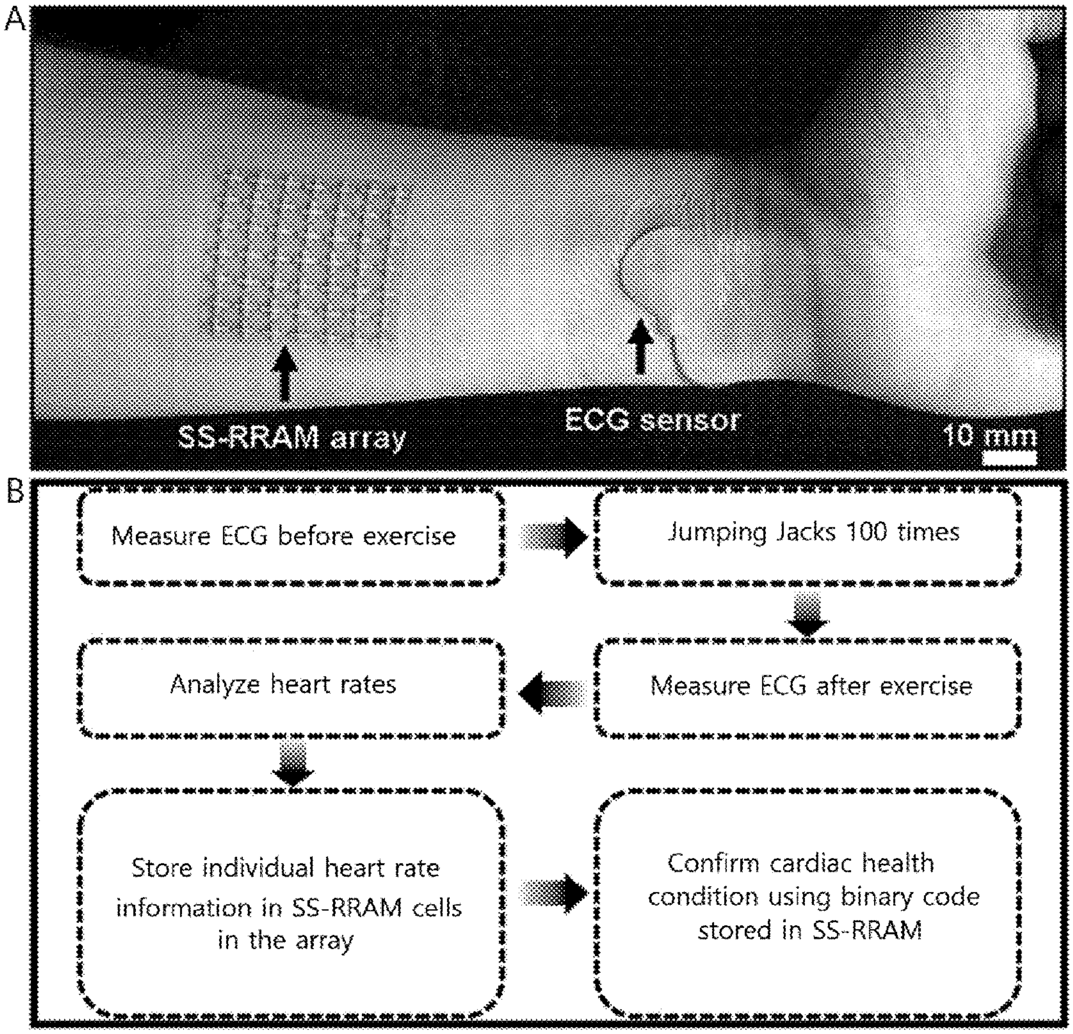
FIG. 12 is a view showing an electrocardiogram sensor and 7×7 memory array manufactured using a self-healing stretchable metal powder composite film applied to the present invention, and a process of measuring heart rates.
Figure 13:
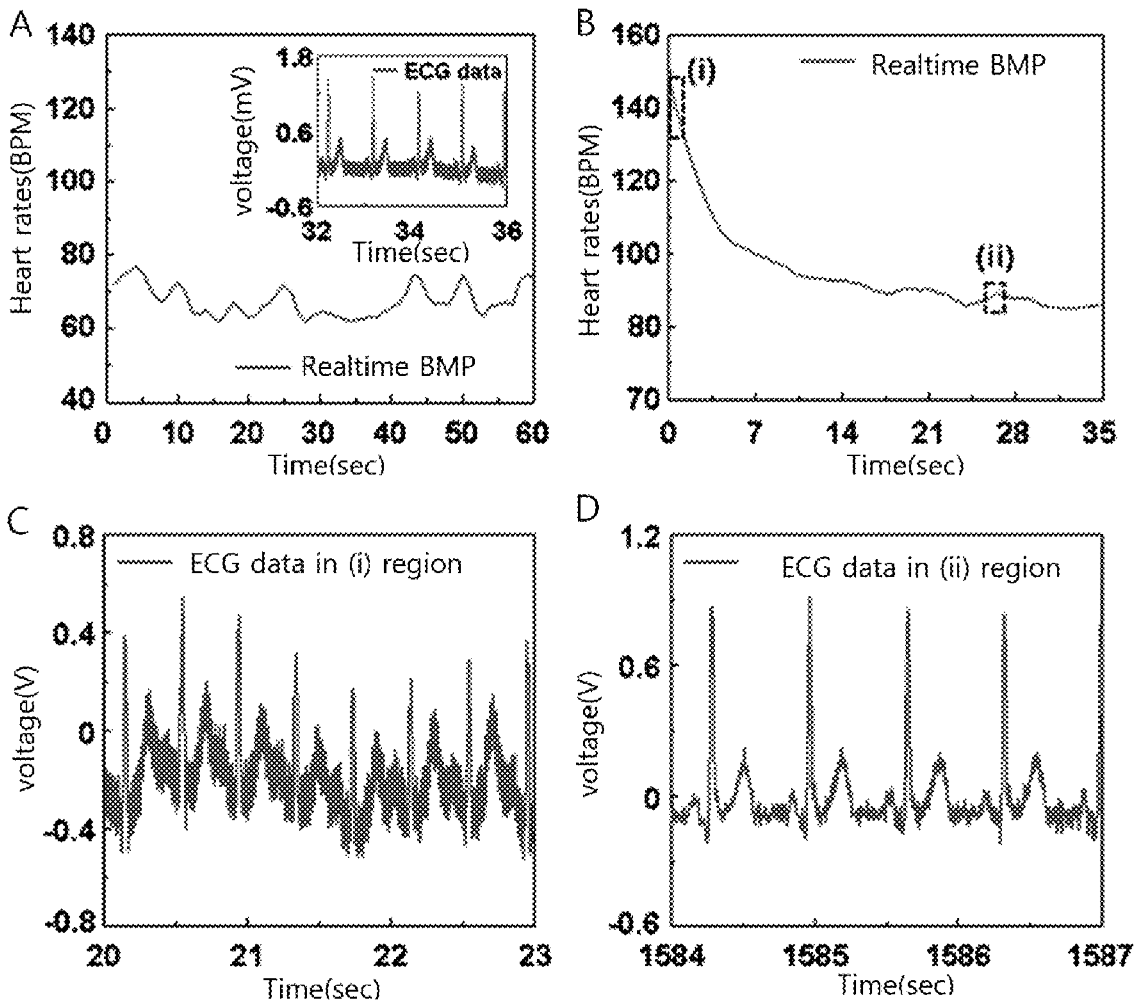
FIG. 13 is a view showing ECG data obtained through an electrocardiogram sensor.
Figure 14:
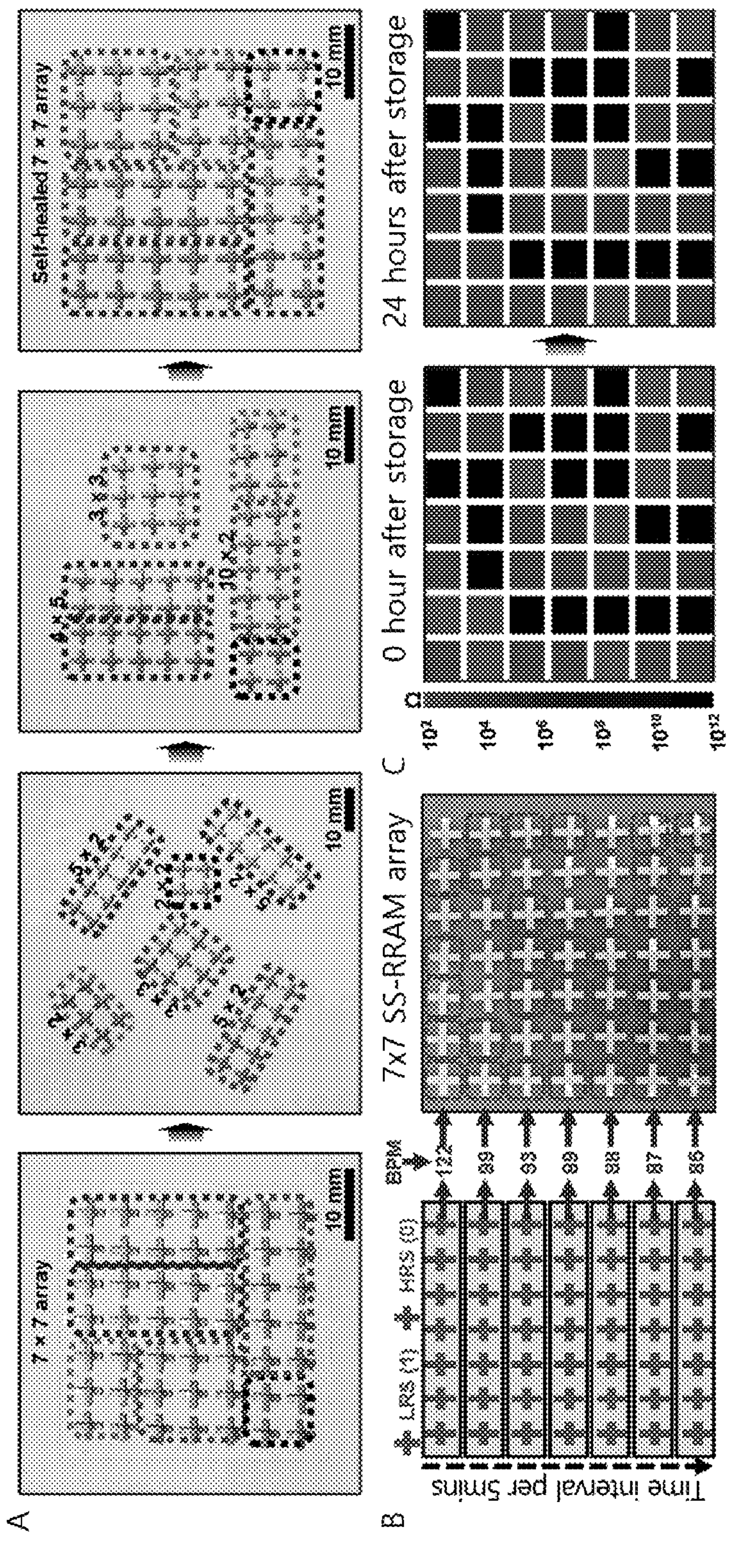
FIG. 14 is a view showing that a memory element manufactured in a 7×7 array form may be reconstructed in various sizes, and confirming memory characteristics by storing heart rate information in a memory array in a binary format and reading the heart rate information after 24 hours.

FIG. 12 is a view showing an electrocardiogram sensor and a memory element manufactured using a self-healing composite film applied to the present invention, and a process of measuring heart rates. FIG. 13 is a view showing ECG data obtained through an electrocardiogram sensor. FIG. 14 is a view showing that a memory element manufactured in a 7×7 array form may be reconstructed in various sizes, and confirming memory characteristics by storing heart rate information in a memory array in a binary format and reading the heart rate information after 24 hours.

It is confirmed that the stretchable self-healing resistive random-access memory according to an embodiment of the present invention may operate in a size ranging from a few nm to a few mm, preferably ranging from 10 nm to 10 mm.

<Stable Data Storage of Cardiac Signals Using Reconfigurable 7×7 SS-RRAM Array>

Heart rates gradually increase during exercise. After finishing the exercise, the beats-per-minute (BPM) is recovered slowly. The trend of BPM change may be an important indicator for precisely making a diagnosis of abnormal cardiovascular parasympathetic functions that normally occur after finishing an exercise. To confirm feasibility of the SS-RRAM in the field of medical application, stable data storage of electrocardiogram (ECG) signals generated from the human body is demonstrated using an ECG electrode having a low impedance value (65Ω) at 79 Hz (FIGS. 12 and 13).

Before starting measurement of electrophysiological signals, a 7×7 SS-RRAM array and an ECG electrode are mounted on the wrist (FIG. 12A). To improve skin conformability, the SS-RRAM array and the ECG electrode are encapsulated using a transparent rubber film (3M Tegaderm, USA) (FIG. 12B). Details of the experiment setting and the sequential process for measuring the ECG signals are shown in FIG. 12B.

First, ECG signals (BPM values ranging from 62 to 79) are measured before exercise (FIG. 13A). ECG signals are also recorded after doing one-hundred times of jumping jacks (FIG. 13B), and it shows a typical trend of BPM decrease in a healthy body. In addition, it is similar to those of previous reports about (i) rapid recovery and (ii) recovery saturation (FIGS. 13C and 13D). Such information should be stably stored in the SS-RRAM cells.

The memory device array of the present invention may be reconfigured and rescaled owing to the self-healing property (FIG. 14A). This unique characteristic may potentially optimize the data storage capacity according to the amount of biomedical signal information. To store the information, average BPM data (122, 99, 93, 89, 88, 87, and 85 every 5 minutes) at intervals of a total of 35 minutes are individually transformed into binary numbers (1111010, 1100011, 1011101, 1011001, 1011000, 1010111, and 1010101), respectively (FIG. 14B, left: schematic view showing RRAM cells with LRS (in BLACK color) and RRAM cells with HRS (in gray color); right: set as LRS of corresponding images with black dotted box). This data storage may be shown as an electrical resistance map for better readability (FIG. 14C). Such personal information is stably maintained even after 24 hours (FIG. 14C, right). This function may be further reliable with respect to perspiration on the skin through encapsulation of the hydrophobic SHP film on the SS-RRAM device.

The description of the present invention described above is for illustrative purposes, and those skilled in the art will understand that the present invention may be easily modified into other specific forms without changing the technical spirit or essential features of the present invention. Therefore, the embodiments described above should be understood in all respects as illustrative and not restrictive. For example, each component described in a single form may be implemented in a distributed manner, and similarly, components described as being distributed may also be implemented in a combined form.

The scope of the present invention is indicated by the patent claims described below, and all changes or modified forms derived from the meaning and scope of the claims and their equivalent concepts should be construed as being included in the scope of the present invention.

The stretchable self-healing resistive random-access memory and a manufacturing method thereof according to an embodiment of the present invention provides an effect of showing stable memory performance even in a stretched environment owing to strong interactions between conductive metal particles.

The stretchable self-healing resistive random-access memory and a manufacturing method thereof according to an embodiment of the present invention provides an effect of allowing development of stretchable memory through stress distribution and stretchability of self-healing polymers, and allowing development of memory devices using various conductive metal fillers, of which the manufacturing method is very simple owing to the self-healing properties, when a mechanism used for development of resistive random-access memory is used.

It should be understood that the effects of the present invention are not limited to the effects described above, and include all effects that can be inferred from the configuration of the present invention described in the detailed description or claims of the present invention.

DESCRIPTION OF REFERENCE NUMERALS

1: Resistive random-access memory
2: Self-healing composite film
3: Self-healing polymer
4: Metal powder
10: Conducting layer
20: Insulating layer

What is claimed is:

1. A stretchable self-healing resistive random-access memory formed by stacking a self-healing stretchable composite film manufactured to have a metal composite bilayer, of which one side is formed as a conducting layer having abundant metal, and the other side is formed as an insulating layer, as it has a concentration gradient of micro- or nano-sized metal powder in a self-healing polymer, so that the insulating layer is bonded to the conducting layer.

2. The stretchable self-healing resistive random-access memory according to claim 1, wherein the metal powder has a size ranging from 1 nm to 999 μm.

3. The stretchable self-healing resistive random-access memory according to claim 1, wherein a weight ratio of the self-healing polymer and the metal powder is ranging from 1:20 to 20:1.

4. The stretchable self-healing resistive random-access memory according to claim 3, wherein a solvent is one or more selected from a group configured of Chloroform, Acetone, Hexane, Methanol, Ethanol, Isopropyl alcohol, Butanol, Tetrahydrofuran (THF), Dichloromethane, Toluene, Ether, Cyclohexane, Ethyl acetate, Methyl Isobutyl Ketone (MIBK), and Acetonitrile.

5. The stretchable self-healing resistive random-access memory according to claim 1, wherein the insulating layer has a thickness ranging from 1 nm to 1 mm to have characteristics of the resistive random-access memory.

6. The stretchable self-healing resistive random-access memory according to claim 1, wherein the insulating layer has a resistance ranging from10Ω to 99TΩ to have characteristics of a resistive random-access memory.

7. The stretchable self-healing resistive random-access memory according to claim 1, wherein a metal forming the metal powder is one or more selected from a group configured of Ag, Au, Cu, Al, W, Mo, Ti, Cr, Pt, and Ni.

8. The stretchable self-healing resistive random-access memory according to claim 1, wherein the self-healing polymer includes an elastomer material using, as a backbone, any one among polydimethylsiloxane (PDMS), polyethyleneoxide (PEO), Perfluoropolyether (PFPE), polybutylene (PB), poly (ethylene-co-1-butylene), poly (butadiene), hydrogenated poly (butadiene), poly (ethylene oxide)-poly (propylene oxide) block copolymer or random copolymer, and poly (hydroxyalkanoate).

9. The stretchable self-healing resistive random-access memory according to claim 8, wherein the self-healing polymer further includes MPU (4,4'-methylenebis (phenyl urea) unit) or isophorone bisurea units (IU).

10. The stretchable self-healing resistive random-access memory according to claim 1, wherein the stretchable self-healing resistive random-access memory has a size ranging from 10 nm to 10 mm.

11. A method of manufacturing stretchable self-healing resistive random-access memory, the method comprising the steps of:

manufacturing a mixed solution of self-healing polymer and metal powder (S10);

manufacturing a self-healing composite film having a metal composite bilayer in which a concentration gradient of the metal powder is formed such that one side is formed as a conducting layer having abundant metal powder and the other side is formed as an insulating layer (S20); and manufacturing the resistive random-access memory (S30).

12. The method of manufacturing stretchable self-healing resistive random-access memory according to claim 11, wherein the metal powder at the step of manufacturing a mixed solution of self-healing polymer and metal powder (S10) has a size ranging from 1 nm to 999 μm.

13. The method of manufacturing stretchable self-healing resistive random-access memory according to claim 11, wherein a metal forming the metal powder at the step of manufacturing a mixed solution of self-healing polymer and metal powder (S10) is one or more selected from a group configured of Ag, Au, Cu, Al, W, Mo, Ti, Cr, Pt, and Ni.

14. The method of manufacturing stretchable self-healing resistive random-access memory according to claim 11, wherein the self-healing polymer at the step of manufacturing a mixed solution of self-healing polymer and metal powder (S10) includes an elastomer material using, as a backbone, any one among polydimethylsiloxane (PDMS), polyethyleneoxide (PEO), Perfluoropolyether (PFPE), polybutylene (PB), poly (ethylene-co-1-butylene), poly (butadiene), hydrogenated poly (butadiene), poly (ethylene oxide)-poly (propylene oxide) block copolymer or random copolymer, and poly (hydroxyalkanoate).

15. The method of manufacturing stretchable self-healing resistive random-access memory according to claim 11, wherein the self-healing polymer at the step of manufacturing a mixed solution of self-healing polymer and metal powder (S10) further includes MPU (4,4'-methylenebis (phenyl urea) unit) or isophorone bisurea units (IU).

16. The method of manufacturing stretchable self-healing resistive random-access memory according to claim 11, wherein a weight ratio of the self-healing polymer and the metal powder at the step of manufacturing a mixed solution of self-healing polymer and metal powder (S10) is ranging from 1:20 to 20:1, and the mixed solution of self-healing polymer and metal powder is manufactured by mixing 0.01 to 10 g of the mixed solution of self-healing polymer and metal powder with 1 mL of solvent.

17. The method of manufacturing stretchable self-healing resistive random-access memory according to claim 16, wherein a solvent is one or more selected from a group configured of Chloroform, Acetone, Hexane, Methanol, Ethanol, Isopropyl alcohol, Butanol, Tetrahydrofuran (THF), Dichloromethane, Toluene, Ether, Cyclohexane, Ethyl acetate, Methyl Isobutyl Ketone (MIBK), and Acetonitrile.

18. The method of manufacturing stretchable self-healing resistive random-access memory according to claim 11, wherein the step of manufacturing a self-healing composite film in which a concentration gradient of metal powder is formed (S20) is a step of drying the mixed solution of self-healing polymer and metal powder, which is manufactured to have a viscosity of creating a concentration gradient of metal powder, onto a film when drying the solution.

19. The method of manufacturing stretchable self-healing resistive random-access memory according to claim 11, wherein the insulating layer formed on the self-healing composite film manufactured at the step of manufacturing a self-healing composite film in which a concentration gradient of metal powder is formed (S20) has a thickness ranging from 1 nm to 1 mm to have characteristics of a resistive random-access memory.

20. The method of manufacturing stretchable self-healing resistive random-access memory according to claim 11, wherein the insulating layer formed on the self-healing composite film manufactured at the step of manufacturing a self-healing composite film in which a concentration gradient of metal powder is formed (S20) has a resistance ranging from10Ω to 99TΩ to have the characteristics of a resistive random-access memory.

21. The method of manufacturing stretchable self-healing resistive random-access memory according to claim 11, wherein the insulating layer formed on the self-healing composite film manufactured at the step of manufacturing a self-healing composite film in which a concentration gradient of metal powder is formed (S20) has a weight ratio of the self-healing polymer and the metal powder ranging from1: 20 to 20:1.

22. The method of manufacturing stretchable self-healing resistive random-access memory according to claim 11, wherein the step of manufacturing the resistive random-access memory (S30) is a step of manufacturing the resistive random-access memory by laminating the manufactured self-healing composite film so that a conducting layer side and an insulating layer side face each other.

* * * * *